US010777970B2

(12) United States Patent
Han et al.

(10) Patent No.: US 10,777,970 B2
(45) Date of Patent: Sep. 15, 2020

(54) METAMATERIAL-BASED REFLECTOR, OPTICAL CAVITY STRUCTURE INCLUDING THE SAME AND VERTICAL CAVITY SURFACE EMITTING LASER

(71) Applicants: SAMSUNG ELECTRONICS CO., LTD., Suwon-si (KR); UNIVERSITY OF MASSACHUSETTS, Boston, MA (US)

(72) Inventors: Seunghoon Han, Seoul (KR); Byunghoon Na, Suwon-si (KR); Babak Mirzapourbeinekalaye, Amherst, MA (US); Amir Arbabi, Sunderland, MA (US)

(73) Assignees: SAMSUNG ELECTRONICS CO., LTD., Suwon-si (KR); UNIVERSITY OF MASSACHUSETTS, Boston, MA (US)

( * ) Notice: Subject to any disclaimer, the term of this patent is extended or adjusted under 35 U.S.C. 154(b) by 0 days.

(21) Appl. No.: 16/441,661

(22) Filed: Jun. 14, 2019

(65) Prior Publication Data
US 2020/0073029 A1    Mar. 5, 2020

Related U.S. Application Data

(60) Provisional application No. 62/726,529, filed on Sep. 4, 2018.

(30) Foreign Application Priority Data

Jan. 7, 2019    (KR) .......................... 10-2019-0001926

(51) Int. Cl.
*H01S 5/00*    (2006.01)
*H01S 5/183*    (2006.01)

(52) U.S. Cl.
CPC ...... *H01S 5/18361* (2013.01); *H01S 5/18369* (2013.01); *H01S 5/18375* (2013.01); *H01S 5/18377* (2013.01); *H01S 5/183* (2013.01)

(58) Field of Classification Search
CPC ............. H01S 5/18361; H01S 5/18377; H01S 5/18369; H01S 5/18375; H01S 5/183
See application file for complete search history.

(56) References Cited

U.S. PATENT DOCUMENTS 8,576,890 B2    11/2013    Fattal et al.
9,728,930 B2    8/2017    Williams et al.
(Continued)

FOREIGN PATENT DOCUMENTS

EP    1820244    8/2007
WO    2017176921 A1    10/2017
WO    2018/067837 A1    4/2018

OTHER PUBLICATIONS

Communication dated Jan. 23, 2020, issued by the European Patent Office in counterpart European Application No. 19185188.0.

*Primary Examiner* — Kinam Park
(74) *Attorney, Agent, or Firm* — Sughrue Mion, PLLC

(57) ABSTRACT

Provided is a metamaterial-based reflector including a first metamaterial layer including an array of first nanostructures, and a second metamaterial layer provided on the first metamaterial layer, the second metamaterial layer including an array of second nanostructures, wherein an arrangement of the second nanostructures is different from an arrangement the first nanostructures.

27 Claims, 29 Drawing Sheets

(56) References Cited

U.S. PATENT DOCUMENTS

| | | |
|---|---|---|
| 2008/0219307 A1* | 9/2008 | Birkedal ................. H01S 5/183 |
| | | 372/44.01 |
| 2009/0097522 A1 | 4/2009 | Justice et al. |
| 2013/0170018 A1* | 7/2013 | Domash .................... G02F 1/29 |
| | | 359/320 |
| 2018/0131100 A1* | 5/2018 | Ouyang ............... G02B 5/3058 |
| 2018/0156949 A1 | 6/2018 | Tsai et al. |
| 2019/0154877 A1* | 5/2019 | Capasso ................. G02B 1/002 |
| 2020/0025893 A1* | 1/2020 | Jang .................... H01S 5/18394 |

* cited by examiner

Wavelength (nm)

METAMATERIAL-BASED REFLECTOR, OPTICAL CAVITY STRUCTURE INCLUDING THE SAME AND VERTICAL CAVITY SURFACE EMITTING LASER

CROSS-REFERENCE TO RELATED APPLICATIONS

This application claims the benefit of U.S. Provisional Application No. 62/726,529, filed on Sep. 4, 2018, in the U.S. Patent and Trademark Office, and priority from Korean Patent Application No. 10-2019-0001926, filed on Jan. 7, 2019 in the Korean Intellectual Property Office, the disclosures of which are incorporated herein in their entireties by reference.

BACKGROUND

1. Field

Example embodiments of the present disclosure relate to reflectors (mirrors), optical cavity structures including the reflectors, and vertical cavity surface emitting lasers.

2. Description of the Related Art

Vertical cavity surface emitting lasers (VCSELs) have shorter optical gain lengths than edge emitting lasers (EELs), and thus may be reduced in power consumption. In addition, the VCSELs may be fabricated as two-dimensional arrays due to vertical light emission, and thus is advantageous for high-density integration and mass production. While EELs according to the related art have asymmetrical light outputs, the VCSELs provide circular symmetrical output modes, so that they may be efficiently connected to optical fibers and stable high-speed modulation with low noise is possible.

A VCSEL is provided with a distributed Bragg reflector (DBR) having a high reflectivity of about 98% or more to constitute a laser resonator. The DBR composed of pairs of two materials having different refractive indices usually requires several tens of pairs of stacked structures in order to obtain a high reflectivity. In addition, the DBR has low thermal conductivity (or high thermal resistance) due to phonon scattering occurring at the boundary between the two materials. There is a need for a technique and a method capable of improving light control and light emission characteristics while compensating for disadvantages of the DBR.

SUMMARY

One or more example embodiments provide metamaterial-based reflectors using nanostructure arrays.

Further, one or more example embodiments provide metamaterial-based reflectors capable of easily controlling light characteristics such as polarization and convergence/divergence.

Further still, one or more example embodiments provide optical cavity structures and vertical cavity surface emitting lasers (VCSELs) to which the metamaterial-based reflectors are applied.

Additional aspects will be set forth in part in the description which follows and, in part, will be apparent from the description, or may be learned by practice of example embodiments.

According to an aspect of an example embodiment, there is provided a metamaterial-based reflector including a first metamaterial layer including an array of first nanostructures, and a second metamaterial layer provided on the first metamaterial layer, the second metamaterial layer including an array of second nanostructures, wherein the second nanostructures are arranged differently from the first nanostructures.

The first nanostructures may be arranged in a first direction and in a first pattern, and the second nanostructures may be arranged in a second direction that is different from the first direction and in a second pattern that is different from the first pattern.

The first nanostructures may be arranged in parallel with each other in a first direction, and the second nanostructures may be arranged in a second direction that is different from the first direction or in a plurality of directions that are different from the first direction based on regions of the second metamaterial layer.

The first metamaterial layer may include a transmissive wave plate, and the second metamaterial layer may include a reflective wave plate.

The first nanostructures may be arranged in parallel with each other in a first direction, and the second nanostructures may be arranged in parallel with each other in a second direction that is rotated by θ with respect to the first direction, θ being less than 90 degrees.

The first nanostructures may be arranged in parallel with each other in a first direction, and the second nanostructures may be arranged in a plurality of directions that are rotated with respect to the first direction, and angles of rotation of the second nanostructures are different based on regions of the second metamaterial layer.

The metamaterial-based reflector may be configured to circularly polarize light that is transmitted through the metamaterial-based reflector.

The second nanostructures may be arranged such that the metamaterial-based reflector operates as a converging mirror or a diverging mirror.

The first metamaterial layer may include a first transmissive wave plate and the second metamaterial layer comprises a second transmissive wave plate, and the metamaterial-based reflector may further include a distributed Bragg reflector provided on the second metamaterial layer opposite to the first metamaterial layer.

The first nanostructures may be arranged in parallel with each other in a first direction, and the second nanostructures may be arranged in parallel with each other in a second direction that is rotated by θ with respect to the first direction, θ being less than 90 degrees.

The first nanostructures may be arranged in parallel with each other in a first direction, and the second nanostructures may be arranged in a plurality of directions that are rotated with respect to the first direction, and angles of rotation of the second nanostructures are different based on regions of the second metamaterial layer.

The metamaterial-based reflector may be configured to linearly polarize light that is transmitted through the metamaterial-based reflector.

The second nanostructures may be arranged so that the metamaterial-based reflector is configured to operate as a converging mirror or a diverging mirror.

According to another aspect of an example embodiment, there is provided an optical device including at least one metamaterial-based reflector, wherein the at least one metamaterial-based reflector includes a first metamaterial layer including an array of first nanostructures, and a second metamaterial layer provided on the first metamaterial layer, the second metamaterial layer including an array of second nanostructures, wherein the second nanostructures are arranged differently from the first nanostructures.

According to another aspect of an example embodiment, there is provided an optical cavity structure including a gain layer configured to generate light, a first distributed Bragg reflector provided on a first surface of the gain layer, and a metamaterial-based reflector provided on a second surface of the gain layer opposite to the first distributed Bragg reflector, wherein the metamaterial-based reflector includes a first metamaterial layer including an array of first nanostructures, and a second metamaterial layer provided on the first metamaterial layer, the second metamaterial layer including an array of second nanostructures, wherein the second nanostructures are arrange differently from the first nanostructures.

The first nanostructures may be arranged in parallel with each other in a first direction, and the second nanostructures may be arranged in parallel with each other in a second direction that is different from the first direction or arranged in a plurality of directions that are rotated from the first direction based on regions of the second metamaterial layer.

The first nanostructures may be arranged in parallel with each other in a first direction, and the second nanostructures may be arranged in parallel with each other in a second direction that is rotated by θ with respect to the first direction, θ being less than 90 degrees.

The first nanostructures may be arranged in parallel with each other in a first direction, and the second nanostructures may be arranged in a plurality of directions that are rotated with respect to the first direction, and angles of rotation of the second nanostructures are different based on regions of the second metamaterial layer.

The first metamaterial layer may include a transmissive wave plate, and the second metamaterial layer may include a reflective wave plate.

The first metamaterial layer may include a first transmissive wave plate and the second metamaterial layer may include a second transmissive wave plate, and the metamaterial-based reflector may further include a distributed Bragg reflector provided on the second metamaterial layer opposite to the first metamaterial layer.

The metamaterial-based reflector may be configured to circularly polarize light transmitted through the metamaterial-based reflector.

The metamaterial-based reflector may be configured to linearly polarize light transmitted through the metamaterial-based reflector.

The second nanostructures may be arranged so that the metamaterial-based reflector is configured to operate as a converging mirror or a diverging mirror.

According to another aspect of an example embodiment, there is provided a vertical cavity surface emitting laser including an optical cavity structure, the optical cavity structure including a gain layer configured to generate light, a distributed Bragg reflector provided on a first surface of the gain layer, and a metamaterial-based reflector provided on a second surface of the gain layer opposite to the distributed Bragg reflector, wherein the metamaterial-based reflector includes a first metamaterial layer including an array of first nanostructures, and a second metamaterial layer provided on the first metamaterial layer, the second metamaterial layer including an array of second nanostructures, wherein the second nanostructures are provided differently from the first nanostructures.

The optical cavity structure may further include a contact layer provided between the gain layer and the metamaterial-based reflector.

The optical cavity structure may further include an aperture layer provided on the gain layer, the aperture layer being configured to adjust at least one of a size of light and an oscillation of light.

The optical cavity structure may further include a first electrode that is provided on the first surface of the gain layer and a second electrode that is provided on the second surface of the gain layer.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1A:
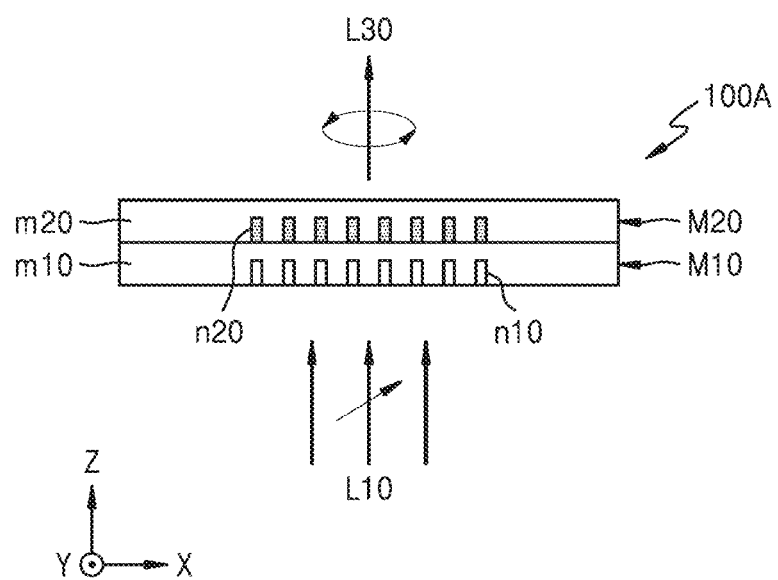
FIGS. 1A and 1B are cross-sectional views of a metamaterial-based reflector according to an example embodiment.

Reference will now be made in detail to example embodiments of which are illustrated in the accompanying drawings, wherein like reference numerals refer to like elements throughout. In this regard, example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, metamaterial-based reflectors and optical cavity structures and vertical cavity surface emitting lasers (VCSELs) which include the metamaterial-based reflectors, according to example embodiments, will be described with reference to the accompanying drawings. Widths and thicknesses of layers or areas illustrated in the drawings may be exaggerated for clarity of the specification and convenience of description.

Figure 1B:
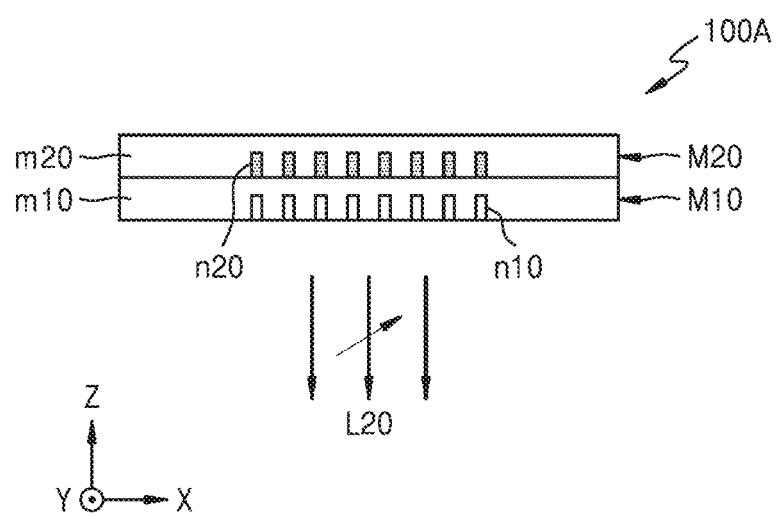

FIGS. 1A and 1B are cross-sectional views of a metamaterial-based reflector 100A according to an example embodiment. FIG. 1A shows transmission characteristics of incident light, and FIG. 1B shows characteristics of reflected light. The metamaterial-based reflector 100A may be referred to as a metasurface mirror or a nanostructure-based mirror.

Referring to FIGS. 1A and 1B, the metamaterial-based reflector 100A may include a first metamaterial layer M10 including an array of a plurality of first nanostructures n10, and a second metamaterial layer M20 located on the first metamaterial layer M10 and including an array of a plurality of second nanostructures n20. The plurality of second nanostructures n20 may be arranged differently from the plurality of first nanostructures n10. The arrangement direction and arrangement scheme of the plurality of second nanostructures n20 may be different from those of the plurality of first nanostructures n10. For example, the plurality of first nanostructures n10 may be arranged in parallel with each other in a first direction, and the plurality of second nanostructures n20 may be arranged in a direction different from the first direction. The first metamaterial layer M10 may be referred to as a first nanostructure array layer, and the second metamaterial layer M20 may be referred to as a second nanostructure array layer. The first metamaterial layer M10 may include a first material layer m10, and the second metamaterial layer M20 may include a second material layer m20. The refractive index of the first material layer m10 may be less than the refractive index of the first nanostructure n10, and the refractive index of the second material layer m20 may be less than the refractive index of the second nanostructure n20. The first material layer m10 and the second material layer m20 may be in contact with the plurality of first nanostructure n10 and the plurality of second nanostructure n20, while covering and encapsulating the plurality of first nanostructures n10 and the plurality of second nanostructures n20, respectively. That is, the first metamaterial layer M10 may include a plurality of first nanostructures n10 and a first material layer m10 covering and encapsulating the plurality of first nanostructures n10, and the second metamaterial layer M20 may include a plurality of second nanostructures n20 and a second material layer m20 covering and encapsulating the plurality of second nanostructures n20. The first and second material layers m10 and m20 may be dielectrics or insulators.

In the example embodiment, the first metamaterial layer M10 may be a transmissive wave plate and the second metamaterial layer M20 may be a reflective wave plate. For example, the first metamaterial layer M10 may be a transmissive quarter wave plate and the second metamaterial layer M20 may be a reflective half wave plate. In this case, the metamaterial-based reflector 100A may function as a reflector, for example, a mirror, without a separate mirror member. The metamaterial-based reflector 100A may be a bilayer metasurface mirror. The second metamaterial layer M20 may be designed as a reflective type according to the material, shape, size, pattern interval, etc. of the second nanostructure n20 and may operate as a reflective half wave plate.

Referring to FIG. 1A, the metamaterial-based reflector 100A may be configured to circularly polarize light that is transmitted therethrough such as transmitted light L30. When incident light L10 is linearly polarized by +45 degrees with respect to the X axis, the transmitted light L30 may be circularly polarized by the metamaterial-based reflector 100A.

Referring to FIG. 1B, light that is reflected, such as reflected light L20, by the metamaterial-based reflector 100A may maintain the linearly polarized state of the incident light L10 in FIG. 1A. That is, the reflected light L20 may be linearly polarized by +45 degrees with respect to the X axis.

Figure 2A:
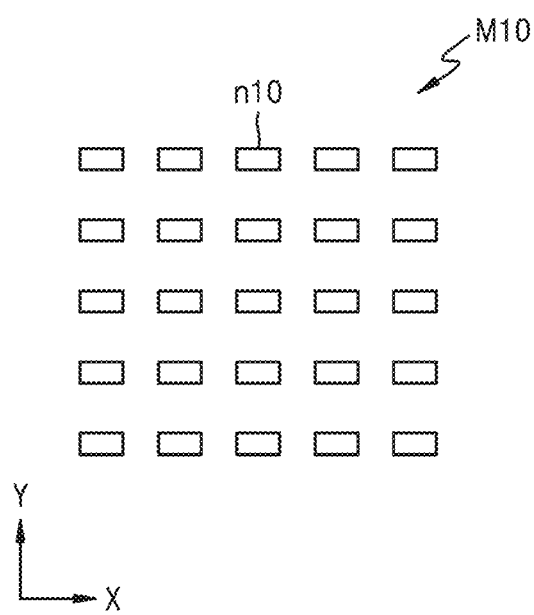
FIG. 2A is a plan view of an array of a plurality of first nanostructures included in a first metamaterial layer of FIGS. 1A and 1B.
Figure 2B:
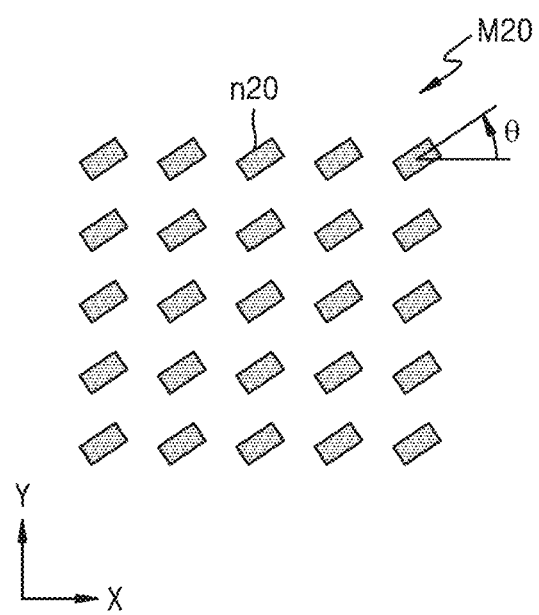
FIG. 2B is a plan view of an array of a plurality of second nanostructures included in a second metamaterial layer of FIGS. 1A and 1B.

FIG. 2A is a plan view of an array of the plurality of first nanostructures n10 included in the first metamaterial layer M10 of FIGS. 1A and 1B, and FIG. 2B is a plan view of an array of the plurality of second nanostructures n20 included in the second metamaterial layer M20 of FIGS. 1A and 1B.

Referring to FIG. 2A, the plurality of first nanostructures n10 may be arranged in parallel with each other in a first direction, for example, an X-axis direction, and may be arranged two-dimensionally.

Referring to FIG. 2B, the plurality of second nanostructures n20 may be arranged in parallel with each other in a second direction rotated by θ with respect to the first direction. θ may be less than 90 degrees.

By changing the arrangement direction of the plurality of second nanostructures n20 with respect to the arrangement direction of the plurality of first nanostructures n10, the metamaterial-based reflector 100A including the first nanostructures n10 and the second nanostructures n20 may have optical characteristics as described with reference to FIGS. 1A and 1B.

Figure 3A:
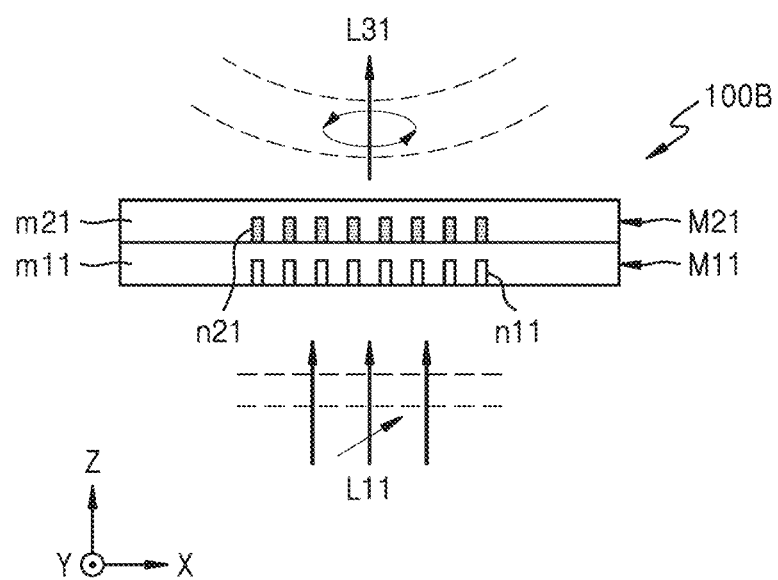
FIGS. 3A and 3B are cross-sectional views of a metamaterial-based reflector according to an example embodiment.
Figure 3B:
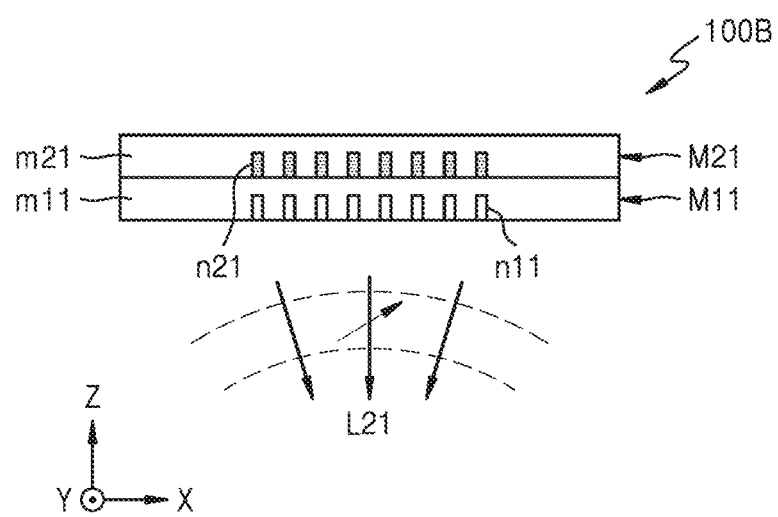

FIGS. 3A and 3B are cross-sectional views of a metamaterial-based reflector 100B according to an example embodiment. FIG. 3A shows transmission characteristics of incident light, and FIG. 3B shows characteristics of reflected light.

Referring to FIGS. 3A and 3B, the metamaterial-based reflector 100B may include a first metamaterial layer M11 including an array of a plurality of first nanostructures n11, and a second metamaterial layer M21 located on the first metamaterial layer M11 and including an array of a plurality of second nanostructures n21. The plurality of second nanostructures n21 may be arranged differently from the plurality of first nanostructures n11. For example, the plurality of first nanostructures n11 may be arranged in parallel with each other in the first direction, and the arrangement direction of the plurality of second nanostructures n21 may be changed depending on regions of the second metamaterial layer M21. The first metamaterial layer M11 may include a first material layer m11, and the second metamaterial layer M21 may include a second material layer m21. That is, the first metamaterial layer M11 may include a plurality of first nanostructures n11 and a first material layer m11 covering and encapsulating the plurality of first nanostructures n11, and the second metamaterial layer M21 may include a plurality of second nanostructures n21 and a second material layer m21 covering and encapsulating the plurality of second nanostructures n21.

In the example embodiment, the first metamaterial layer M11 may be a transmissive wave plate and the second metamaterial layer M21 may be a reflective wave plate. For example, the first metamaterial layer M11 may be a transmissive quarter wave plate and the second metamaterial layer M21 may be a reflective half wave plate.

The metamaterial-based reflector 100B according to the example embodiment may act as a converging mirror or a diverging mirror. Based on whether the metamaterial-based reflector 100B acts as a converging mirror or a diverging mirror, the arrangement of the plurality of second nanostructures n21 may be determined.

Referring to FIG. 3A, the metamaterial-based reflector 100B may be configured to circularly polarize light that is transmitted therethrough such as transmitted light L31. When incident light L11 is linearly polarized by +45 degrees with respect to the X axis, the transmitted light L31 may be circularly polarized by the metamaterial-based reflector 100B.

Referring to FIG. 3B, light that is reflected, such as reflected light L21, by the metamaterial-based reflector 100B may maintain the linearly polarized state of the incident light L11 in FIG. 3A. That is, the reflected light L21 may be linearly polarized by +45 degrees with respect to the X axis. The metamaterial-based reflector 100B may act as a converging mirror with a focal length f with respect to the incident light L11 as illustrated in FIG. 3A that is linearly polarized by +45 degrees. To this end, the arrangement direction of the plurality of second nanostructures n21 may be changed depending on regions of the second metamaterial layer M21, as described below with reference to FIG. 4B. The reflected light L21 may have a converging wavefront with a focal length f. The metamaterial-based reflector 100B may act as a diverging mirror with a negative focal length −f with respect to incident light linearly polarized by −45 degrees.

Referring back to FIG. 3A, with respect to the incident light L11 linearly polarized by +45 degrees, the transmitted light L31 may be circularly polarized light having a converging wavefront corresponding to the focal length f.

Figure 4A:
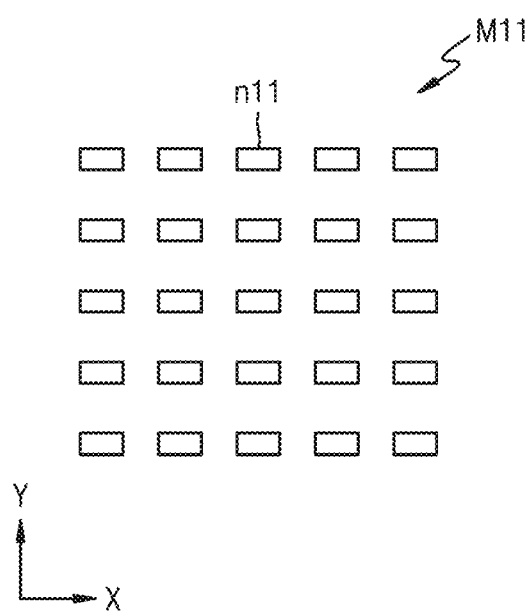
FIG. 4A is a plan view of an array of a plurality of first nanostructures included in a first metamaterial layer of FIGS. 3A and 3B.
Figure 4B:
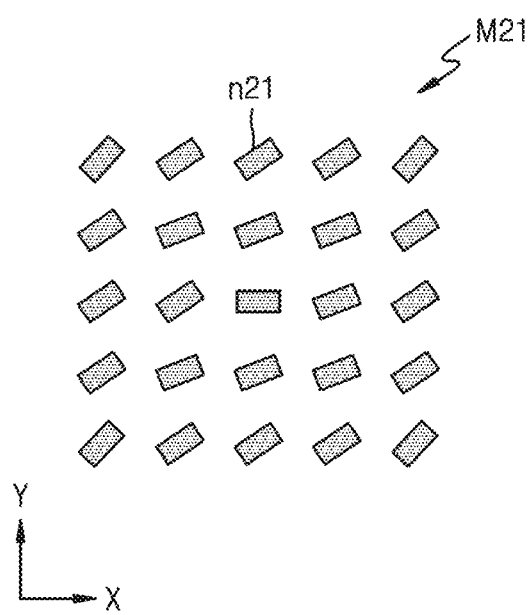
FIG. 4B is a plan view of an array of a plurality of second nanostructures included in a second metamaterial layer of FIGS. 3A and 3B.

FIG. 4A is a plan view of an array of the plurality of first nanostructures n11 included in the first metamaterial layer M11 of FIGS. 3A and 3B, and FIG. 4B is a plan view of an array of the plurality of second nanostructures n21 included in the second metamaterial layer M21 of FIGS. 3A and 3B.

Referring to FIG. 4A, the plurality of first nanostructures n11 may be arranged in parallel with each other in the first direction, for example, the X-axis direction.

Referring to FIG. 4B, the plurality of second nanostructures n21 may be arranged to be rotated with respect to the first direction, and the rotation angle of the second nanostructure n21 may vary depending on regions of the second metamaterial layer M21. The rotation angle of the second nanostructure n21 may gradually increase toward the outer periphery of the second metamaterial layer M21 with respect to a predetermined point, for example, the center of the second metamaterial layer M21. In this manner, by changing the arrangement direction of the plurality of second nanostructures n21 with respect to the arrangement direction of the plurality of first nanostructures n11 and changing the rotation angle depending on the regions of the second metamaterial layer M21, the metamaterial-based reflector 100B including the first nanostructures n11 and the second nanostructures n21 may have optical characteristics as described with reference to FIGS. 3A and 3B.

As described in the above example embodiments, the first metamaterial layers M10 and M11 may be transmissive wave plates and the second metamaterial layers M20 and M21 may be reflective wave plates. However, example embodiments are not limited thereto. According to an example embodiment, a first metamaterial layer may be a first transmissive wave plate and a second metamaterial layer may be a second transmissive wave plate. As such, when the first metamaterial layer and the second metamaterial layer are transmissive wave plates, a separate mirror member, for example, a distributed Bragg reflector (DBR), may be further provided on the second metamaterial layer as illustrated in FIGS. 5A to 8B.

Figure 5A:
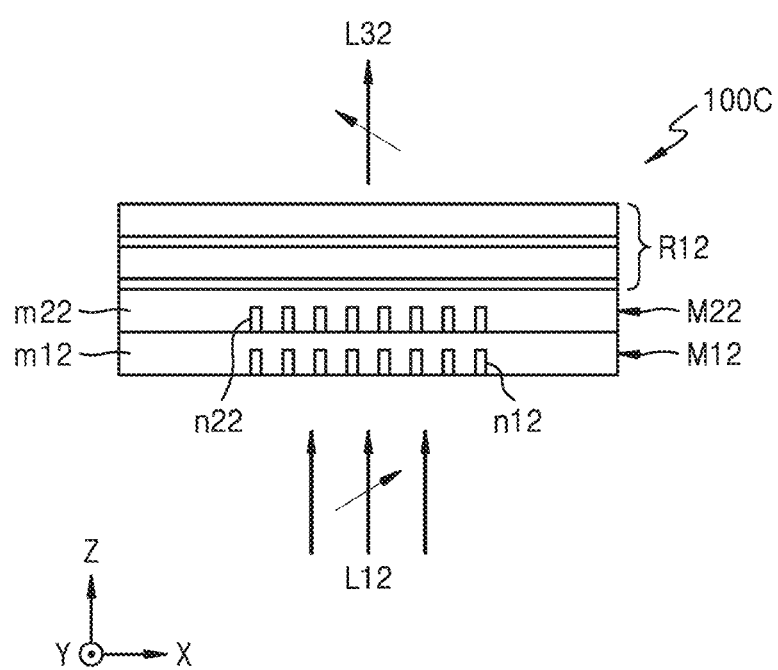
FIGS. 5A and 5B are cross-sectional views of a metamaterial-based reflector according to an example embodiment.
Figure 5B:
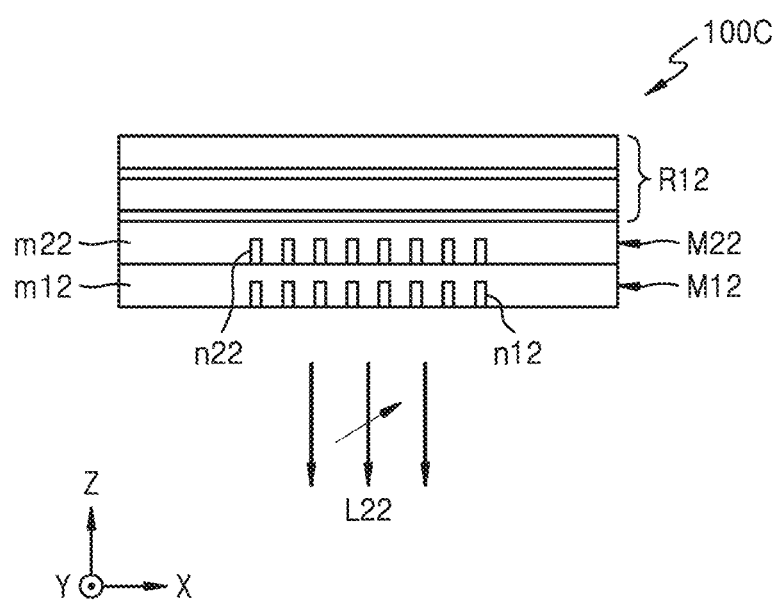

FIGS. 5A and 5B are cross-sectional views of a metamaterial-based reflector 100C according to an example embodiment. FIG. 5A shows transmission characteristics of incident light, and FIG. 5B shows characteristics of reflected light.

Referring to FIGS. 5A and 5B, the metamaterial-based reflector 100C may include a first metamaterial layer M12 including an array of a plurality of first nanostructures n12, and a second metamaterial layer M22 located on the first metamaterial layer M12 and including an array of a plurality of second nanostructures n22. The plurality of second nanostructures n22 may be arranged differently from the plurality of first nanostructures n12. For example, the plurality of first nanostructures n12 may be arranged in parallel with each other in the first direction, and the plurality of second nanostructures n22 may be arranged in a direction different from the first direction. The first metamaterial layer M12 may include a first material layer m12, and the second metamaterial layer M22 may include a second material layer m22.

In the example embodiment, the first metamaterial layer M12 may be a first transmissive wave plate and the second metamaterial layer M22 may be a second transmissive wave plate. In this example, the metamaterial-based reflector 100C may further include a separate mirror member, for example, a DBR R12, provided on the second metamaterial layer M22 opposite to the first metamaterial layer M12. The second metamaterial layer M22 may be a transmissive layer according to the material, shape, size, pattern interval, etc. of the second nanostructure n22 and may operate as a transmissive wave plate. The DBR R12 may be formed by alternately and repeatedly stacking two material layers having different refractive indexes to a thickness of about ¼ of an oscillation wavelength. The reflectivity of the DBR R12 may be controlled by controlling a difference between refractive indexes of the two material layers of the DBR R12 and the number of times a pair of the two material layers are repeatedly stacked. The DBR R12 may be formed by alternately stacking, for example, amorphous silicon (a-Si) and silicon oxide ($SiO_2$). However, the materials of the DBR R12 are not limited thereto. Various materials capable of forming a refractive index difference may be used as the materials of the DBR R12.

Referring to FIG. 5A, the metamaterial-based reflector 100C may be configured to linearly polarize light that is transmitted therethrough such as transmitted light L32. When incident light L12 is linearly polarized by +45 degrees with respect to the X axis, the transmitted light L32 may be linearly polarized by −45 degrees by the metamaterial-based reflector 100C.

Referring to FIG. 5B, light that is reflected, such as reflected light L22, by the metamaterial-based reflector 100C may maintain the linearly polarized state of the incident light L12 in FIG. 5B. That is, the reflected light L22 may be linearly polarized by +45 degrees with respect to the X axis.

Figure 6A:
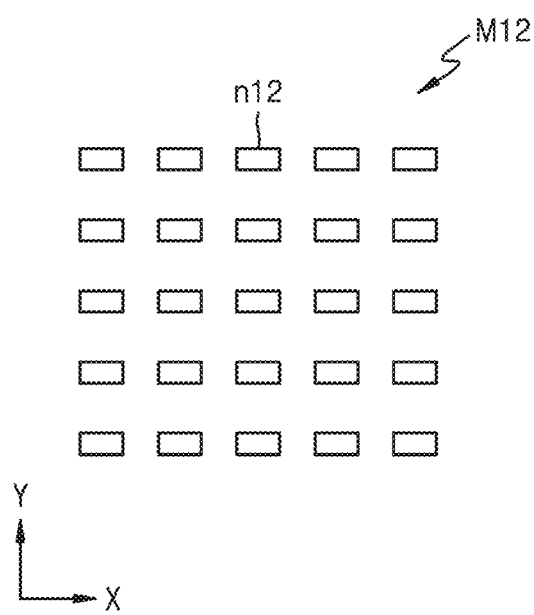
FIG. 6A is a plan view of an array of a plurality of first nanostructures included in a first metamaterial layer of FIGS. 5A and 5B.
Figure 6B:
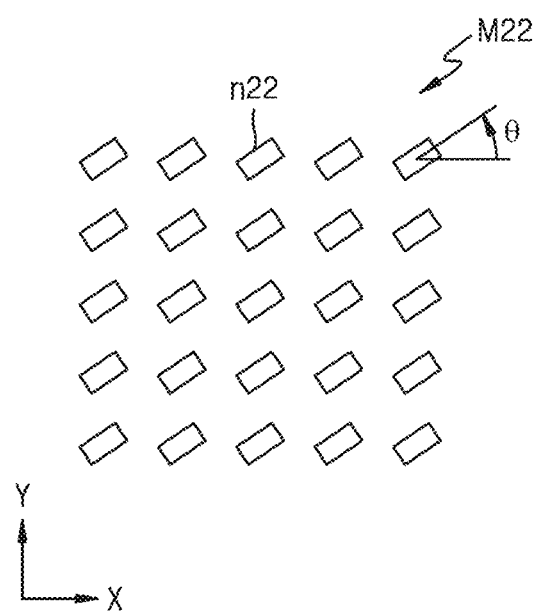
FIG. 6B is a plan view of an array of a plurality of second nanostructures included in a second metamaterial layer of FIGS. 5A and 5B.

FIG. 6A is a plan view of an array of the plurality of first nanostructures n12 included in the first metamaterial layer M12 of FIGS. 5A and 5B, and FIG. 6B is a plan view of an array of the plurality of second nanostructures n22 included in the second metamaterial layer M22 of FIGS. 5A and 5B.

Referring to FIG. 6A, the plurality of first nanostructures n12 may be arranged in parallel with each other in the first direction, for example, the X-axis direction.

Referring to FIG. 6B, the plurality of second nanostructures n22 may be arranged in parallel with each other in a second direction rotated by θ with respect to the first direction. θ may be less than 90 degrees.

By changing the arrangement direction of the plurality of second nanostructures n22 with respect to the arrangement direction of the plurality of first nanostructures n12, the metamaterial-based reflector 100C including the first nanostructures n12 and second nanostructures n22 may have optical characteristics as described with reference to FIGS. 5A and 5B. The phase of the reflected light L22 in FIG. 5B may be controlled by adjusting the arrangement direction, for example, the rotation angle of the second nanostructures n22 with respect to the arrangement direction of the first nanostructures n12.

When incident light is polarized according to any one of the polarization eigenstates of the metamaterial-based reflector 100C, the polarization of the incident light may be changed to an elliptical polarization when the incident light passes through the first metamaterial layer M12. When elliptical polarized light passes through the second metamaterial layer M22, the polarization of the elliptical polarized light may be converted to linear polarization. For example, when the first metamaterial layer M12 acts as a quarter wave plate, the polarization state of light between the first metamaterial layer M12 and second metamaterial layer M22 may be circular.

Figure 7A:
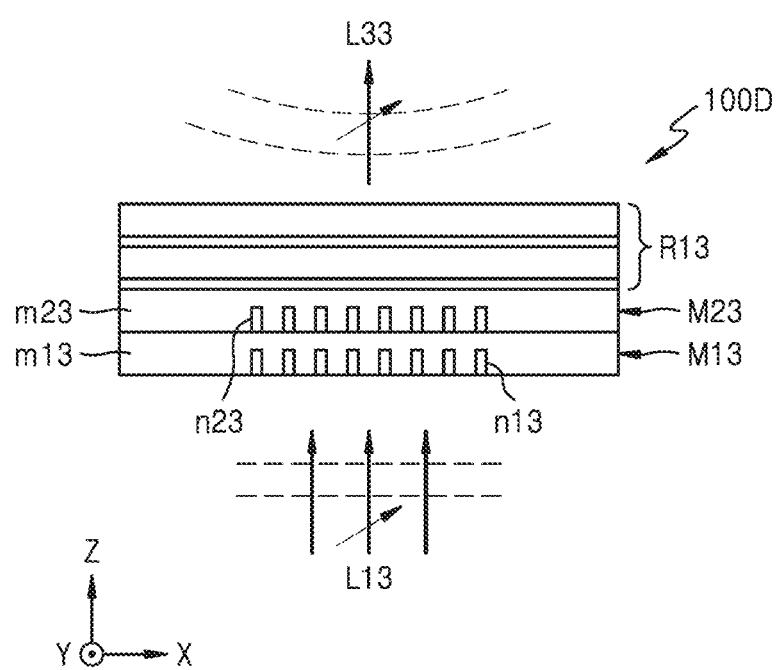
FIGS. 7A and 7B are cross-sectional views of a metamaterial-based reflector according to an example embodiment.
Figure 7B:
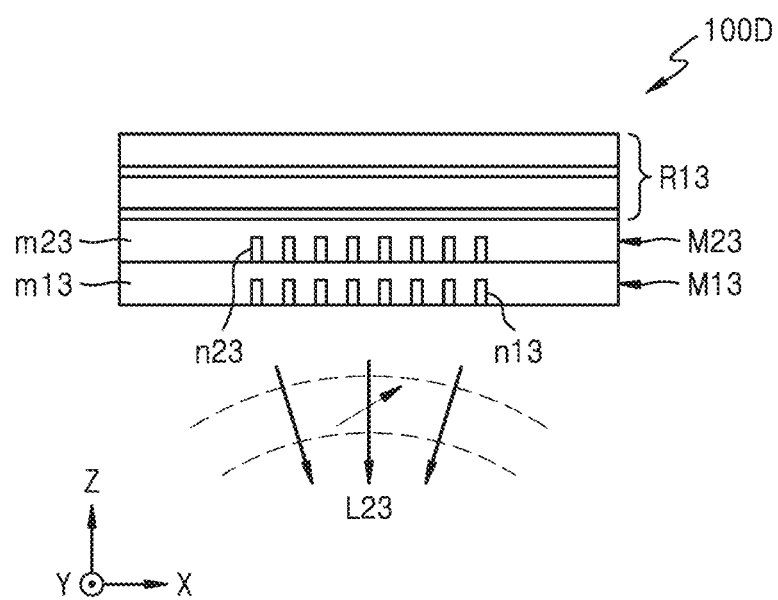

FIGS. 7A and 7B are cross-sectional views of a metamaterial-based reflector 100D according to an example embodiment. FIG. 7A shows transmission characteristics of incident light, and FIG. 7B shows characteristics of reflected light.

Referring to FIGS. 7A and 7B, the metamaterial-based reflector 100D may include a first metamaterial layer M13 including an array of a plurality of first nanostructures n13, and a second metamaterial layer M23 located on the first metamaterial layer M13 and including an array of a plurality of second nanostructures n23. The plurality of second nanostructures n23 may be arranged differently from the plurality of first nanostructures n13. For example, the plurality of first nanostructures n13 may be arranged in parallel with each other in the first direction, and the arrangement direction of the plurality of second nanostructures n23 may be changed depending on regions of the second metamaterial layer M23. The first metamaterial layer M13 may include a first material layer m13, and the second metamaterial layer may include a second material layer m23.

In the example embodiment, the first metamaterial layer M13 may be a first transmissive wave plate and the second metamaterial layer M23 may be a second transmissive wave plate. In this example, the metamaterial-based reflector 100D may further include a separate mirror member, for example, a DBR R13, provided on the second metamaterial layer M23.

The metamaterial-based reflector 100D according to the example embodiment may act as a converging mirror or a diverging mirror. Based on whether the metamaterial-based reflector 100B acts as a converging mirror or a diverging mirror, the arrangement of the plurality of second nanostructures n23 may be determined.

Referring to FIG. 7A, the metamaterial-based reflector 100D may be configured to circularly polarize light that is transmitted therethrough such as transmitted light L33. When incident light L13 is linearly polarized by +45 degrees with respect to the X axis, the transmitted light L33 may maintain a state of being linearly polarized by +45 degrees.

Referring to FIG. 7B, light that is reflected, such as reflected light L23, by the metamaterial-based reflector 100D may maintain the linearly polarized state of the incident light L13 in FIG. 7A. That is, the reflected light L23 may be linearly polarized by +45 degrees with respect to the X axis. The metamaterial-based reflector 100D may act as a converging mirror, a focusing mirror, with a focal length f with respect to the incident light L13 as illustrated in FIG. 7A that is linearly polarized by +45 degrees. To this end, the arrangement direction of the plurality of second nanostructures n23 may be changed depending on regions of the second metamaterial layer M23, as described below with reference to FIG. 8B. The reflected light L23 may have a converging wavefront with a focal length f. The metamaterial-based reflector 100D may act as a diverging mirror with a negative focal length −f with respect to incident light linearly polarized by −45 degrees.

Referring back to FIG. 7A, with respect to the incident light L13 linearly polarized by +45 degrees, the transmitted light L33 may be linearly polarized light having a converging wavefront corresponding to a half focal length, that is, f/2.

Figure 8A:
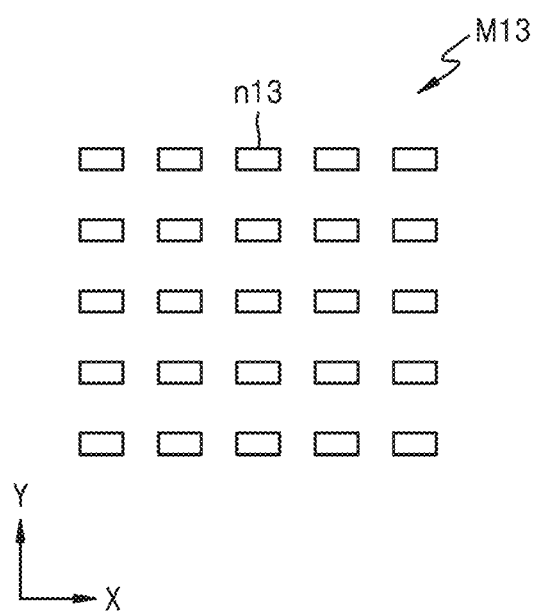
FIG. 8A is a plan view of an array of a plurality of first nanostructures included in a first metamaterial layer of FIGS. 7A and 7B.
Figure 8B:
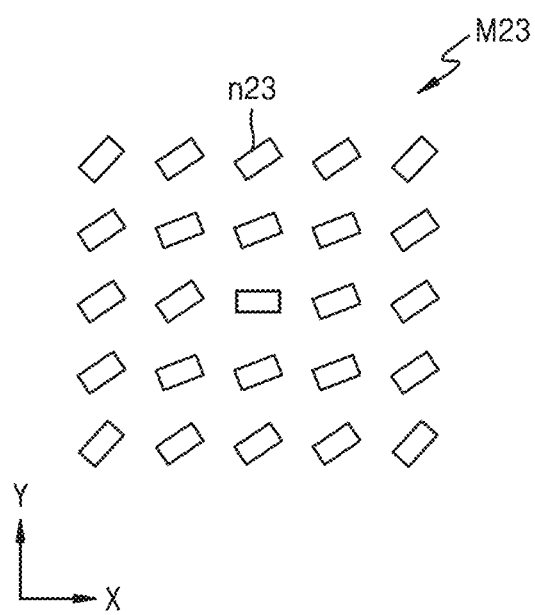
FIG. 8B is a plan view of an array of a plurality of second nanostructures included in a second metamaterial layer of FIGS. 7A and 7B.

FIG. 8A is a plan view of an array of the plurality of first nanostructures n13 included in the first metamaterial layer M13 of FIGS. 7A and 7B, and FIG. 8B is a plan view of an array of the plurality of second nanostructures n23 included in the second metamaterial layer M23 of FIGS. 7A and 7B.

Referring to FIG. 8A, the plurality of first nanostructures n13 may be arranged in parallel with each other in the first direction, for example, the X-axis direction.

Referring to FIG. 8B, the plurality of second nanostructures n23 may be arranged to be rotated with respect to the first direction, and the rotation angle of the second nanostructure n23 may vary depending on regions of the second metamaterial layer M23. The rotation angle of the second nanostructure n23 may gradually increase toward the outer periphery of the second metamaterial layer M23 with respect to a predetermined point, for example, the center of the second metamaterial layer M23. By changing the arrangement direction of the plurality of second nanostructures n23 with respect to the arrangement direction of the plurality of first nanostructures n13 and changing the rotation angle depending on the regions of the second metamaterial layer M23, the metamaterial-based reflector 100D including the first nanostructures n13 and second nanostructures n23 may have optical characteristics as described with reference to FIGS. 7A and 7B.

An example embodiment may realize a metamaterial-based reflector that may more easily control light characteristics such as polarization and convergence/divergence. In a bilayer metasurface mirror including two metamaterial layers, a reflection phase of the bilayer metasurface mirror may be changed by rotating the arrangement direction of the nanostructure such as meta-atoms of one of the two metamaterial layers with respect to the arrangement direction of the nanostructure such as meta-atoms of the other of the two metamaterial layers. The bilayer metasurface mirror may be used to form a Fabry-Perot resonator cavity, and the resonant wavelength of the Fabry-Perot resonator cavity may be adjusted by the rotation angle of the nanostructure such as meta-atoms of one of the two metamaterial layers. Also, by changing, according to regions, the rotation angle of the nanostructure such as meta-atoms of the other of the two metamaterial layers with respect to the arrangement direction of the nanostructure such as meta-atoms of one of the two metamaterial layers, a converging mirror or a diverging mirror may be produced.

Each of the first metamaterial layer M12 and the second metamaterial layer M22 in the metamaterial-based reflector 100C described with reference to FIGS. 5A to 6B may be of a transmissive type and have birefringent characteristics, and thus may at least partially act as a wave plate such as a phase retarder. A separate mirror member, for example, DBR R12, may be further provided on the second metamaterial layer M22. When the second metamaterial layer M20 is designed to be reflective, as in the case of the metamaterial-based reflector 100A of FIGS. 1A to 2B, the separate mirror member such as DBR R12 may be excluded.

When the X axis is the fast axis of the first metamaterial layer M12 and the angle between the fast axes of the first and second metamaterial layers M12 and M22 is θ, the Jones matrix for the entire layer is given by Equation 1 below.

$$T = W(\Gamma_1)R(\theta)W(2\Gamma_2)R(-\theta)/W(\Gamma_1) \quad \text{[Equation 1]}$$

In Equation 1, Γ1 denotes a retardation caused by the first metamaterial layer M12, Γ2 denotes a retardation caused by the second metamaterial layer M22, W(Γ) denotes a Jones matrix of a wave plate having a phase retardation, and R(θ) denotes a rotation matrix. Incident light may pass through the first metamaterial layer M12 and the second metamaterial layer M22 in turn, and then through the second metamaterial layer M22 in the opposite direction and then through the first metamaterial layer M12 again. W(Γ) may be expressed by Equation 2 below.

$$W(\Gamma) = \begin{bmatrix} 1 & 0 \\ 0 & e^{-j\Gamma} \end{bmatrix} \quad \text{[Equation 2]}$$

Equation 2 is a Jones matrix of a wave plate having a retardation of Γ. In addition, R(θ) may be expressed by Equation 3 below.

$$R(\theta) = \begin{bmatrix} \cos\theta & -\sin\theta \\ \sin\theta & \cos\theta \end{bmatrix} \quad \text{[Equation 3]}$$

Equation 3 is a rotation matrix. When both the first metamaterial layer M12 and second metamaterial layer M22 act as quarter wave plates, that is, when Γ1=Γ2=π/2, a T matrix may be expressed by Equation 4 below.

$$T = \frac{1}{2}\begin{bmatrix} 1 & -1 \\ 1 & 1 \end{bmatrix}\begin{bmatrix} e^{-j2\theta} & 0 \\ 0 & e^{j2\theta} \end{bmatrix}\begin{bmatrix} 1 & 1 \\ -1 & 1 \end{bmatrix} \quad \text{[Equation 4]}$$

Two polarization eigenstates of T may be linearly polarized at +/−45 degrees with respect to the X axis. A reflection phase for these two polarizations may be equal to +/−2θ and may be adjusted by rotating the optical axis of the second metamaterial layer M22 relative to the optical axis of the first metamaterial layer M12. When the first metamaterial layer M12 is not a quarter wave plate, that is, when $\Gamma_1 \neq \pi/2$, the polarization eigenstates may be linearly polarized, but a phase shift less than 2π may be achieved by a change of θ.

A reflection coefficient for the incident light L12 linearly polarized by +45 degrees with respect to the X axis of the metamaterial-based reflector 100C in FIGS. 5A and 5B may be $e^{-j2\theta}$. For example, when the incident light L12 is 1, the reflected light L22 may be $e^{-j2\theta}$. In addition, a reflection coefficient for incident light linearly polarized by −45 degrees with respect to the X axis of the metamaterial-based reflector 100C may also be $e^{-j2\theta}$. A reflection coefficient for the incident light L10 linearly polarized by +45 degrees or −45 degrees with respect to the X axis of the metamaterial-based reflector 100A in FIGS. 1A and 1B may also be $e^{-j2\theta}$.

In the above example embodiments, each of the first nano structures n10 to n13 and the second nanostructures n20 to n23 may have a subwavelength shape dimension. The subwavelength shape dimension means that a thickness or a width, which is a dimension defining the shapes of the first nano structures n10 to n13 and the second nanostructures n20 to n23, is less than operating wavelengths of the metamaterial-based reflectors 100A to 100D. The operating wavelengths of the metamaterial-based reflectors 100A to 100D may mean oscillation wavelengths or resonance wavelengths. At least one of the thickness, width, and arrangement interval (i.e., pitch) of each of the first nano structures n10 to n13 and the second nanostructures n20 to n23 may be less than or equal to ½ of the oscillation wavelength or the resonance wavelength.

The first nano structures n10 to n13 and the second nanostructures n20 to n23 may include a dielectric material or a semiconductor material. For example, the first nano structures n10 to n13 and the second nanostructures n20 to n23 may include any one selected from a single crystal silicon, a poly-crystalline silicon, an amorphous silicon, silicon nitride ($Si_3N_4$), gallium phosphide (GaP), titanium oxide ($TiO_2$), aluminum antimonide (AlSb), aluminum arsenide (AlAs), aluminum gallium arsenide (AlGaAs), aluminum gallium indium phosphide (AlGaInP), boron phosphide (BP), and zinc germanium phosphide ($ZnGeP_2$). The first nano structures n10 to n13 and the second nanostructures n20 to n23 may include a conductive material. As the conductive material, a highly conductive metal material capable of causing surface plasmon excitation may be employed. At least one selected from copper (Cu), aluminum (Al), nickel (Ni), iron (Fe), cobalt (Co), zinc (Zn), titanium (Ti), ruthenium (Ru), rhodium (Rh), palladium (Pd), platinum (Pt), silver (Ag), osmium (Os), iridium (Ir), and gold (Au) may be employed as the conductive material, and an alloy including any one of them may be employed as the conductive material. Furthermore, a two-dimensional material having good conductivity such as graphene, or a conductive oxide may be employed as the conductive material. The first nano structures n10 to n13 and the second nanostructures n20 to n23 may include III-V semiconductor compounds. According to an example embodiment, some of the first nano structures n10 to n13 and the second nanostructures n20 to n23 may include a dielectric material having a relatively high refractive index, and some of the first nano structures n10 to n13 and the second nanostructures n20 to n23 may include a conductive material.

The first nano structures n10 to n13 and the second nanostructures n20 to n23 may be anisotropic nanoelements or may include anisotropic nanoelements. The first nano structures n10 to n13 and the second nanostructures n20 to n23 may have major axes and minor axes on the XY plane. The dimension in the major axis direction may be referred to as a length (L) and the dimension in the minor axis direction may be referred to as a width (W). The dimension in the Z axis direction may be referred to as a thickness (T) or a height (H). The length (L) may be greater than the width (W) and the first nano structures n10 to n13 and the second nanostructures n20 to n23 on the XY plane may have rectangular shapes or shapes similar thereto. The first nano structures n10 to n13 and the second nanostructures n20 to n23 may have generally rectangular shapes with rounded edges. However, embodiments are not limited thereto. For example, the first nano structures n10 to n13 and the second nanostructures n20 to n23 may have elliptical shapes or shapes similar thereto. The first nano structures n10 to n13 and the second nanostructures n20 to n23 may have cross shapes or shapes similar thereto.

A metamaterial-based reflector according to example embodiments may be applied to an optical Fabry-Perot cavity structure. A plurality of Fabry-Perot cavity structures having different wavelengths and/or different beam profiles may be arranged on the same chip to form optical narrow-band filters, laser cavities, or sensors.

Figure 9:
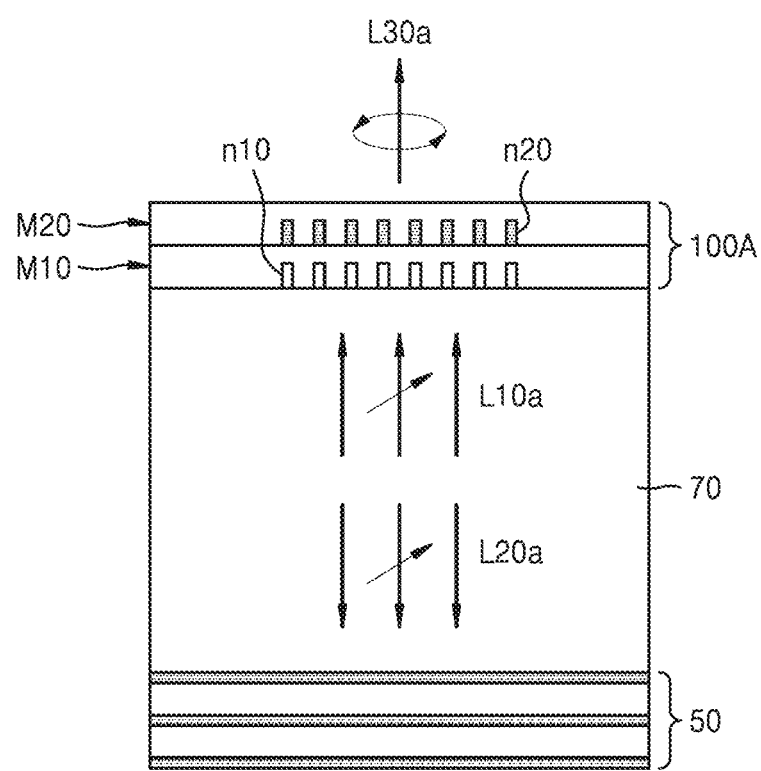
FIG. 9 is a cross-sectional view of an optical cavity structure to which a metamaterial-based reflector is applied according to an example embodiment.

FIG. 9 is a cross-sectional view of an optical cavity structure to which a metamaterial-based reflector is applied according to an example embodiment. The optical cavity structure according to the example embodiment includes the metamaterial-based reflector 100A described with reference to FIGS. 1A and 1B.

Referring to FIG. 9, the optical cavity structure may include an active layer 70, a DBR 50 located on a first surface such as a lower surface of the active layer 70, and a metamaterial-based reflector 100A located on a second surface such as an upper surface of the active layer 70. In this example, the metamaterial-based reflector 100A may be the same as the metamaterial-based reflector 100A described with reference to FIGS. 1A and 1B. The active layer 70 may be located between the DBR 50 and the metamaterial-based reflector 100A. The active layer 70 may be a gain layer including a gain medium and may generate light. The active layer 70 may include, for example, a quantum well or quantum dots and may have a single layer or a multi-layer structure.

The metamaterial-based reflector 100A may include a first metamaterial layer M10 including an array of a plurality of first nanostructures n10, and a second metamaterial layer M20 including an array of a plurality of second nanostructures n20 on the first metamaterial layer M10. The plurality of second nanostructures n20 may be arranged differently from the plurality of first nanostructures n10. The structure and operation of the metamaterial-based reflector 100A in FIG. 9 are the same as those described with reference to FIGS. 1A to 2B.

Arrows L10a and L20a shown in the active layer 70 in FIG. 9 indicate light that is resonated between the DBR 50 and the metamaterial-based reflector 100A, and an arrow L30a shown above the optical cavity structure that is an optical device indicates emitted light such as emitted laser. Light such as laser resonated and amplified between the DBR 50 and the metamaterial-based reflector 100A may be emitted outside the optical device such as the optical cavity structure under certain conditions. The emitted light L30a may be circularly polarized light. The resonant wavelength of the optical cavity structure may be changed by rotation angles of an arrangement of the plurality of second nanostructures n20 relative to an arrangement of the plurality of first nanostructures n10.

Figure 10:
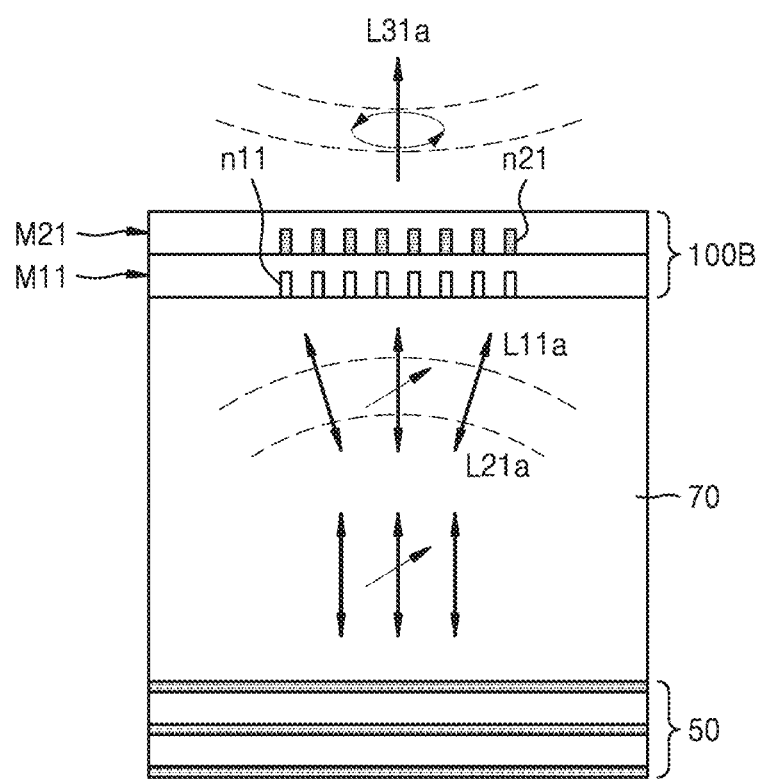
FIG. 10 is a cross-sectional view of an optical cavity structure to which a metamaterial-based reflector is applied according to an example embodiment.

FIG. 10 is a cross-sectional view of an optical cavity structure to which a metamaterial-based reflector is applied according to an example embodiment. The optical cavity structure according to the example embodiment includes the metamaterial-based reflector 100B described with reference to FIGS. 3A and 3B.

Referring to FIG. 10, the optical cavity structure may include an active layer 70, a DBR 50 located on a first surface such as a lower surface of the active layer 70, and a metamaterial-based reflector 100B located on a second surface such as an upper surface of the active layer 70. In this example, the metamaterial-based reflector 100B may be the same as the metamaterial-based reflector 100B described with reference to FIGS. 3A and 3B.

The metamaterial-based reflector 100B may include a first metamaterial layer M11 including an array of a plurality of first nanostructures n11, and a second metamaterial layer M21 including an array of a plurality of second nanostructures n21 on the first metamaterial layer M11. The plurality of second nanostructures n21 may be arranged differently from the plurality of first nanostructures n11. The structure and operation of the metamaterial-based reflector 100B in FIG. 10 may be the same as those described with reference to FIGS. 3A to 4B.

Arrows L11a and L21a shown in the active layer 70 in FIG. 10 indicate light that is resonated between the DBR 50 and the metamaterial-based reflector 100B, and an arrow L31a shown above the optical cavity structure that is an optical device indicates emitted light such as laser. Reflected light L21a reflected by the metamaterial-based reflector 100B may have a converging wavefront. The emitted light L31a may be circularly polarized light having a converging wavefront.

Figure 11:
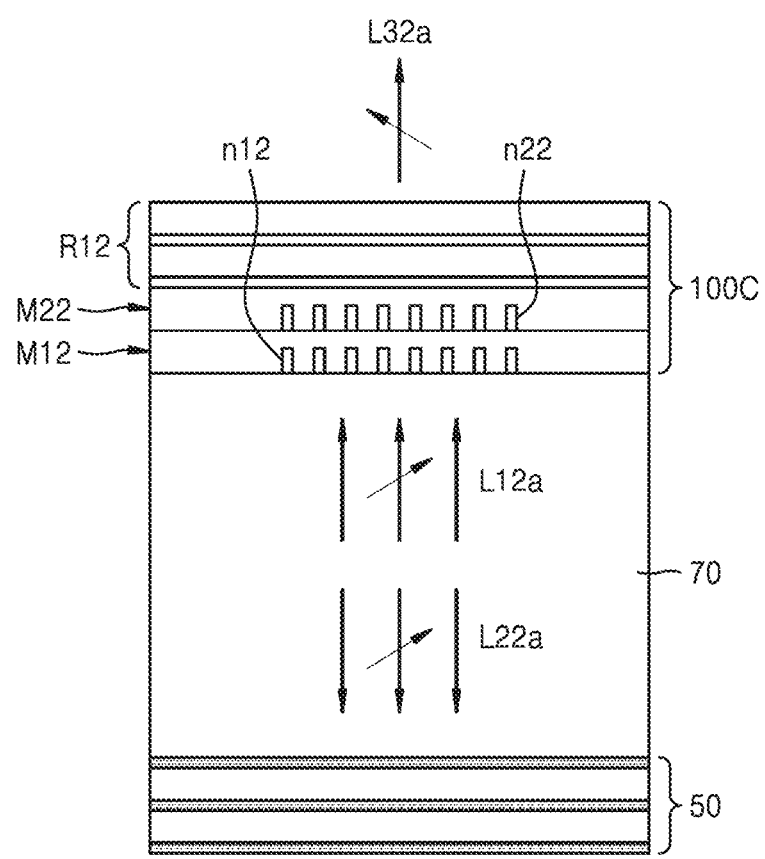
FIG. 11 is a cross-sectional view of an optical cavity structure to which a metamaterial-based reflector is applied according to an example embodiment.

FIG. 11 is a cross-sectional view of an optical cavity structure to which a metamaterial-based reflector is applied according to an example embodiment. The optical cavity structure according to the example embodiment includes the metamaterial-based reflector 100C described with reference to FIGS. 5A and 5B.

Referring to FIG. 11, the optical cavity structure may include a DBR 50, an active layer 70, and a metamaterial-based reflector 100C. In this example, the metamaterial-based reflector 100C may be the same as the metamaterial-based reflector 100C described with reference to FIGS. 5A and 5B. The metamaterial-based reflector 100C may include a first metamaterial layer M12 including an array of a plurality of first nanostructures n12, and a second metamaterial layer M22 including an array of a plurality of second nanostructures n22 on the first metamaterial layer M12. In addition, the metamaterial-based reflector 100C may further include a DBR R12 provided on the second metamaterial layer M22. The structure and operation of the metamaterial-based reflector 100C in FIG. 11 may be the same as those described with reference to FIGS. 5A to 6B.

Arrows L12a and L22a shown in the active layer 70 in FIG. 11 indicate light that is resonated between the DBR 50 and the metamaterial-based reflector 100C, and an arrow L32a shown above the optical cavity structure that is an optical device indicates emitted light such as laser. The emitted light L32a may be linearly polarized light.

Figure 12:
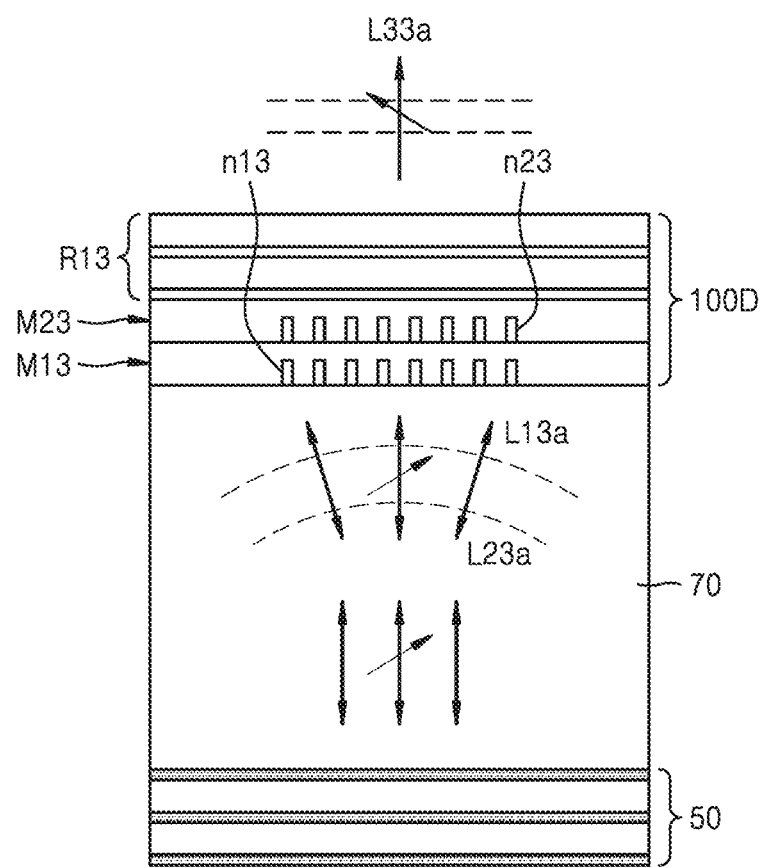
FIG. 12 is a cross-sectional view of an optical cavity structure to which a metamaterial-based reflector is applied according to an example embodiment.

FIG. 12 is a cross-sectional view of an optical cavity structure to which a metamaterial-based reflector is applied according to an example embodiment. The optical cavity structure according to the example embodiment includes the metamaterial-based reflector 100D described with reference to FIGS. 7A and 7B.

Referring to FIG. 12, the optical cavity structure may include a DBR 50, an active layer 70, and a metamaterial-based reflector 100D. In this example, the metamaterial-based reflector 100D may be the same as the metamaterial-based reflector 100D described with reference to FIGS. 7A and 7B. The metamaterial-based reflector 100D may include a first metamaterial layer M13 including an array of a plurality of first nanostructures n13, and a second metamaterial layer M23 including an array of a plurality of second nanostructures n23 on the first metamaterial layer M13. In addition, the metamaterial-based reflector 100D may further include a DBR R13 provided on the second metamaterial layer M23. The structure and operation of the metamaterial-based reflector 100D in FIG. 12 may be the same as those described with reference to FIGS. 7A to 8B.

Arrows L13a and L23a shown in the active layer 70 in FIG. 12 indicate light that is resonated between the DBR 50 and the metamaterial-based reflector 100D, and an arrow L33a shown above the optical cavity structure that is an optical device indicates emitted light such as laser. Reflected light L23a reflected by the metamaterial-based reflector 100D may have a converging wavefront. The emitted light L33a may be linearly polarized light and may have a flat wavefront. Due to resonance characteristics in the optical cavity structure, the emitted light L33a may have a flat wavefront rather than a converging wavefront.

FIGS. 9 to 12 illustrate cases where a cavity structure is formed by applying the DBR 50 to a lower portion of the cavity structure and applying a metamaterial-based reflector 100A to 100D to an upper portion of the cavity structure. However, embodiments are not limited thereto. According to an example embodiment, a cavity structure may be formed by applying a first metamaterial-based reflector to a lower portion of the cavity structure and applying a second metamaterial-based reflector to an upper portion of the cavity structure. For example, a cavity structure may be formed by arranging metamaterial-based reflectors, above and under the active layer 70, metamaterial-based reflectors.

Figure 13:
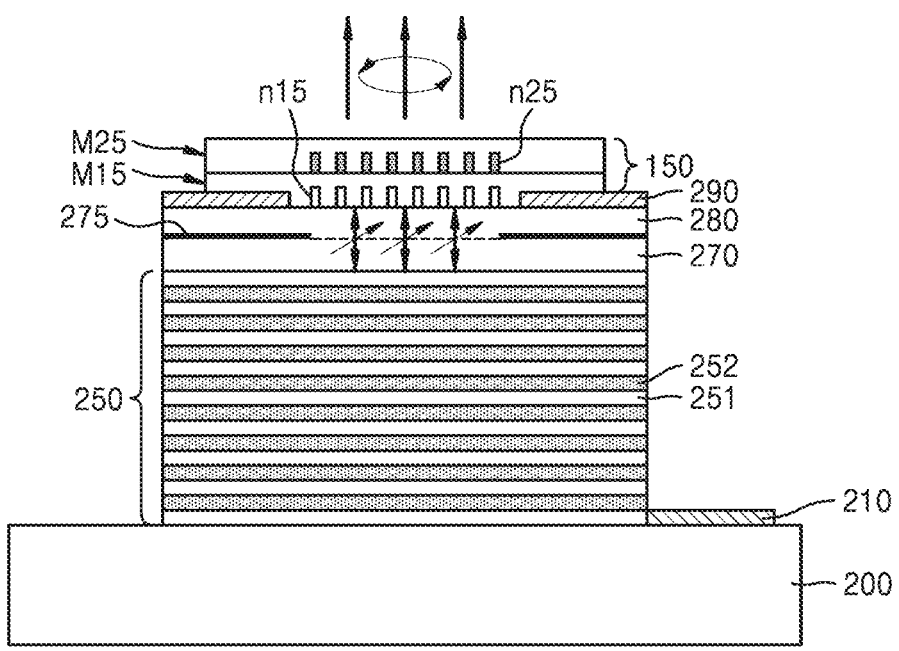
FIG. 13 is a cross-sectional view of a vertical cavity surface emitting laser (VCSEL) including an optical cavity structure using a metamaterial-based reflector according to an example embodiment.

FIG. 13 is a cross-sectional view of a vertical cavity surface emitting laser (VCSEL) including an optical cavity structure using a metamaterial-based reflector according to an example embodiment.

Referring to FIG. 13, the VCSEL may include a gain layer 270 for generating light, a DBR 250 located under the gain layer 270, and a metamaterial-based reflector 150 located on the gain layer 270.

The gain layer 270 may include an active layer including a semiconductor material. The active layer may include, for example, a III-V semiconductor material or a II-VI semiconductor material. As a concrete example, the active layer may include a multi-quantum well (MQW) structure including indium gallium arsenide (InGaAs), aluminum gallium arsenide (AlGaAs), aluminum gallium nitride (AlGaN), indium gallium arsenide phosphide (InGaAsP), indium gallium phosphide (InGaP) or aluminum gallium indium phosphide (AlGaInP). In addition, the active layer may include quantum dots. The material or configuration of the active layer is not limited thereto and may vary. The gain layer 270 may further include a first cladding layer and a second cladding layer, which are respectively provided under and above the active layer. The first cladding layer and the second cladding layer may each include an n-type, p-type, or intrinsic semiconductor material. The first cladding layer and the second cladding layer may include a semiconductor material that is the same as that of the active layer, and may further include n-type dopants or p-type dopants.

The metamaterial-based reflector 150 and the DBR 250 respectively located above and under the gain layer 270 may oscillate light generated in the gain layer 270 to amplify and output light of a certain wavelength band. The reflectivity of the DBR 250 and the metamaterial-based reflector 150 may be set to about 90% or more. The reflectivity of the DBR 250 may be higher than the reflectivity of the metamaterial-based reflector 150. For example, the reflectivity of the DBR 250 may be equal to or greater than about 98% such that light is emitted through the metamaterial-based reflector 150. In some cases, the reflectivity of the DBR 250 and the metamaterial-based reflector 150 may be adjusted to reverse a direction in which light is emitted.

The DBR 250 may be formed by alternately and repeatedly stacking a first material layer 251 and a second material layer 252 having different refractive indexes to a thickness of about ¼ of a desired oscillation wavelength. The DBR 250 may be formed on a semiconductor substrate 200. A difference between refractive indexes of the first material layer 251 and the second material layer 252 of the DBR 250 and the number of times a pair of the first material layer 251 and the second material layer 252 are repeatedly stacked may be adjusted to set the reflectivity of the DBR 250 to a desired value. The DBR 250 may include a material that is the same as or similar to a semiconductor material of the gain layer 270. For example, the first material layer 251 may be an $Al_xGa_{(1-x)}As$ layer, where $0 \leq x \leq 1$, and the second material layer 252 may be an $Al_yGa_{(1-y)}As$ layer, where $0 \leq y \leq 1$ ($x \neq y$). However, the first material layer 251 and the second material layer 252 are not limited thereto. The DBR 250 may be either n-type doped or p-type doped. The material of the DBR 250 is not limited to those described above, and various materials capable of forming a refractive index difference may be used for the first material layer 251 and the second material layer 252.

The VCSEL may further include an aperture layer 275 for adjusting a mode of oscillated light or adjusting a beam size. The aperture layer 275 may include a certain oxide. Although the aperture layer 275 is illustrated as being formed on the gain layer 270, embodiments are not limited thereto. For example, the aperture layer 275 may be located within the DBR 250. Furthermore, the aperture layer 275 may include a plurality of aperture layers or may be omitted.

A contact layer 280, which is in contact with the gain layer 270, may be further provided on the aperture layer 275. The contact layer 280 may include a semiconductor material belonging to a family that is the same as or similar to that of the gain layer 270. The contact layer 280 may be doped with certain impurities.

The VCSEL may further include a first electrode 210 and a second electrode 290 arranged apart from each other with the gain layer 270 therebetween in order to inject a current into the gain layer 270. The first electrode 210 may be electrically connected to a first side of the gain layer 270 and the second electrode 290 may be electrically connected to a second side of the gain layer 270. The first electrode 210 may be located on the substrate 200 exposed toward the side of the DBR 250. The second electrode 290 may be located on an edge portion of the contact layer 280 and may be electrically connected to the gain layer 270 through the contact layer 280. However, the arrangement of the first electrode 210 and the second electrode 290 are not limited thereto. For example, the first electrode 210 may be arranged on the lower surface of the DBR 250 or on the lower surface of the substrate 200.

The metamaterial-based reflector 150 may include a first metamaterial layer M15 including an array of a plurality of first nanostructures n15, and a second metamaterial layer M25 located on the first metamaterial layer M15 and including an array of a plurality of second nanostructures n25. The plurality of second nanostructures n25 may be arranged differently from the plurality of first nanostructures n15. The structure and operation of the metamaterial-based reflector 150 may be the same as those described with reference to FIGS. 1A to 2B. The metamaterial-based reflector 150 may be replaced with the metamaterial-based reflector 100B described with reference to FIGS. 3A to 4B.

Arrows shown in the gain layer 270 in FIG. 13 indicate light that is resonated between the DBR 250 and the metamaterial-based reflector 150, and arrows shown above an optical device, the VCSEL, indicate emitted light such as laser. Light such as laser resonated and amplified between the DBR 250 and the metamaterial-based reflector 150 may be emitted outside the optical device. The emitted light may be circularly polarized light.

Figure 14:
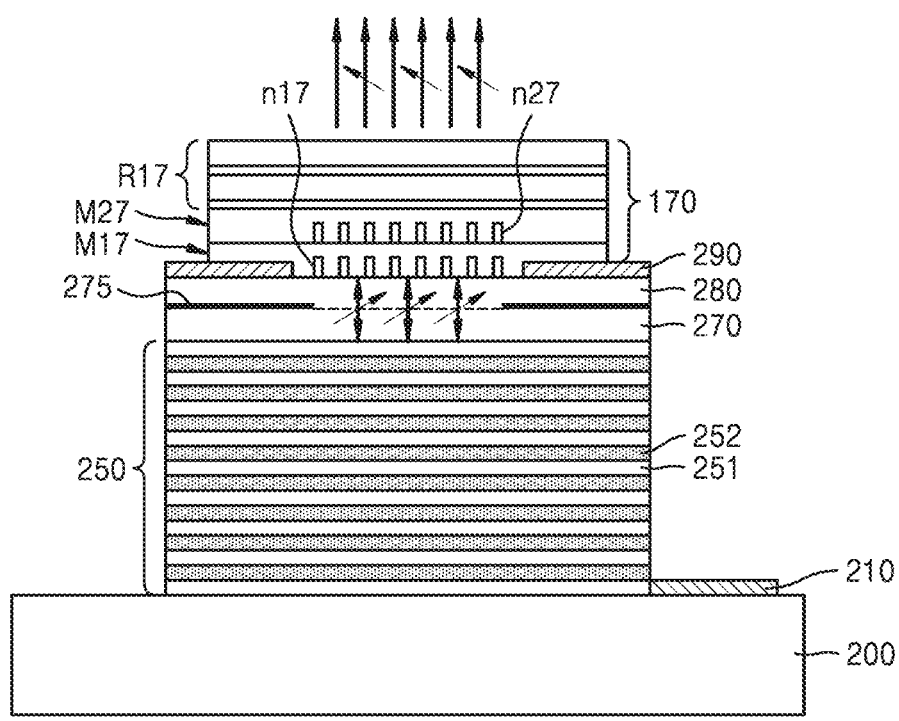
FIG. 14 is a cross-sectional view of a VCSEL including an optical cavity structure using a metamaterial-based reflector according to an example embodiment.

FIG. 14 is a cross-sectional view of a VCSEL including an optical cavity structure using a metamaterial-based reflector 170 according to an example embodiment.

Referring to FIG. 14, the metamaterial-based reflector 170 may include a first metamaterial layer M17 including an array of a plurality of first nanostructures n17, and a second metamaterial layer M27 located on the first metamaterial layer M17 and including an array of a plurality of second nanostructures n27. In addition, the metamaterial-based reflector 170 may further include a DBR R17 provided on the second metamaterial layer M17. The structure and operation of the metamaterial-based reflector 150 may be the same as those described with reference to FIGS. 5A to 6B. The metamaterial-based reflector 170 may be replaced with the metamaterial-based reflector 100D described with reference to FIGS. 7A to 8B. Elements other than the metamaterial-based reflector 170 may be the same as or similar to those described with reference to FIG. 13.

Arrows shown in a gain layer 270 in FIG. 14 indicate light that is resonated between a DBR 250 and a metamaterial-based reflector 170, and arrows shown above an optical device, the VCSEL, indicate emitted light such as laser. The emitted light may be linearly polarized.

In the above example embodiments, the metamaterial-based reflector includes two metamaterial layers. However, the metamaterial-based reflector may include three or more metamaterial layers arranged in the traveling direction, a vertical direction, of light. According to an example embodiment, the metamaterial-based reflector may include a metamaterial layer and a mirror member, e.g., a DBR. This will be described in more detail with reference to FIGS. 15A to 15C.

Figure 15A:
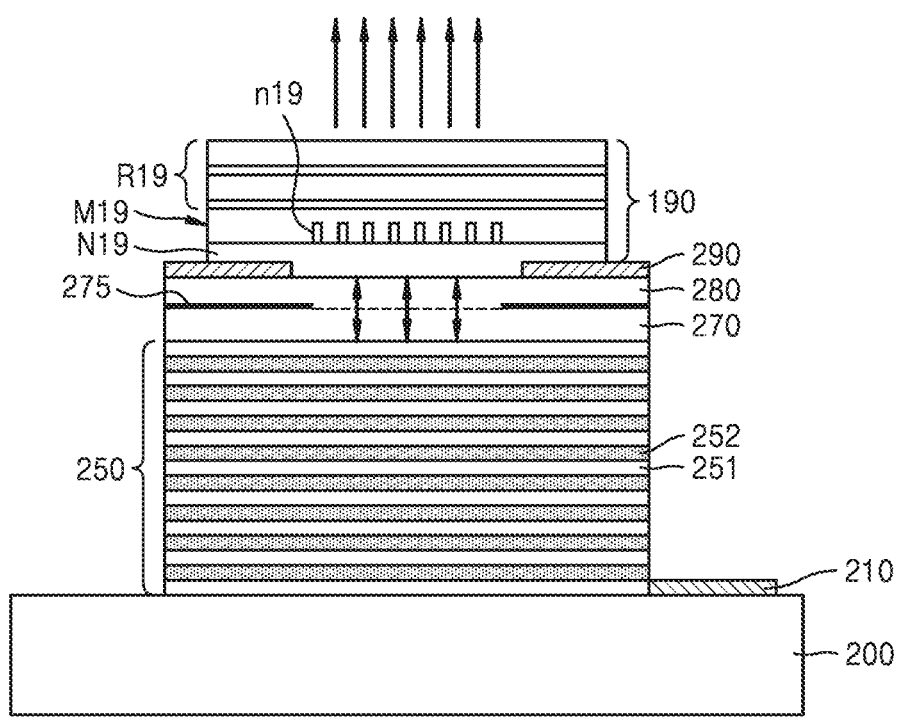
FIG. 15A is a cross-sectional view of a VCSEL including an optical cavity structure using a metamaterial-based reflector according to an example embodiment.

FIG. 15A is a cross-sectional view of a VCSEL including an optical cavity structure using a metamaterial-based reflector 190 according to an example embodiment.

Referring to FIG. 15A, the metamaterial-based reflector 190 may include a metamaterial layer M19 including an array of a plurality of first nanostructures n19, and a DBR R19 provided on the metamaterial layer M19. An insertion layer N19 may be further provided between the metamaterial layer M19 and a contact layer 280 and between the metamaterial layer M19 and a second electrode 290. The insertion layer N19 may be considered to be included in the metamaterial-based reflector 190. In some cases, the insertion layer N19 may not be provided. Elements other than the metamaterial-based reflector 190 may be the same as or similar to those described with reference to FIG. 13. The metamaterial-based reflector 190 includes one metamaterial layer M19 and a general mirror member such as the DBR R19. In this example, the metamaterial layer M19 may be a transmissive birefringent metasurface layer. The DBR R19 may have a structure in which, for example, an amorphous silicon (a-Si) layer and an $SiO_2$ layer are alternately stacked, but the constituent materials of the DBR R19 may be changed.

Arrows shown in a gain layer 270 in FIG. 15A indicate light that is resonated between a DBR 250 and the metamaterial-based reflector 190, and arrows shown above an optical device, the VCSEL, indicate emitted light such as laser. The emitted light may be linearly polarized light. The wavelength of the emitted light may be adjusted by the design of the metamaterial-based reflector 190.

Figure 15B:
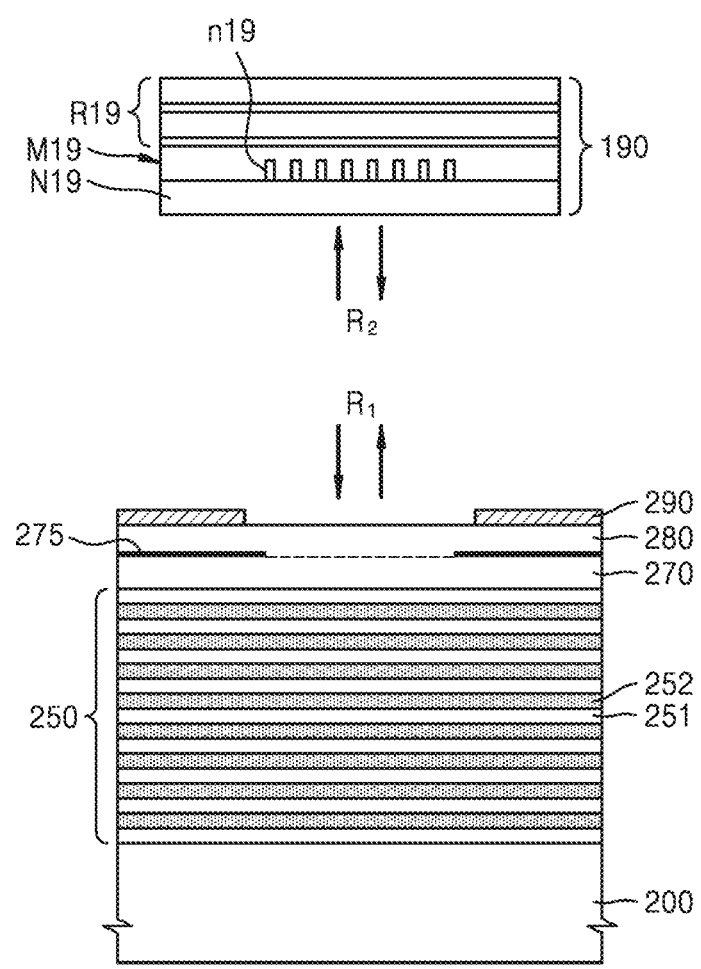
FIG. 15B is an exploded cross-sectional view of the VCSEL of FIG. 15A.

FIG. 15B is an exploded cross-sectional view of the VCSEL of FIG. 15A.

Referring to FIG. 15B, the VCSEL may have a structure in which the DBR 250 and the metamaterial-based reflector 190 are added to the gain layer 270 of a core. In this example, the DBR 250 may have a reflectivity corresponding to $R_1$, and the metamaterial-based reflector 190 may have a reflectivity corresponding to $R_2$. The reflectivity $R_1$ may be greater than the reflectivity $R_2$.

Figure 15C:
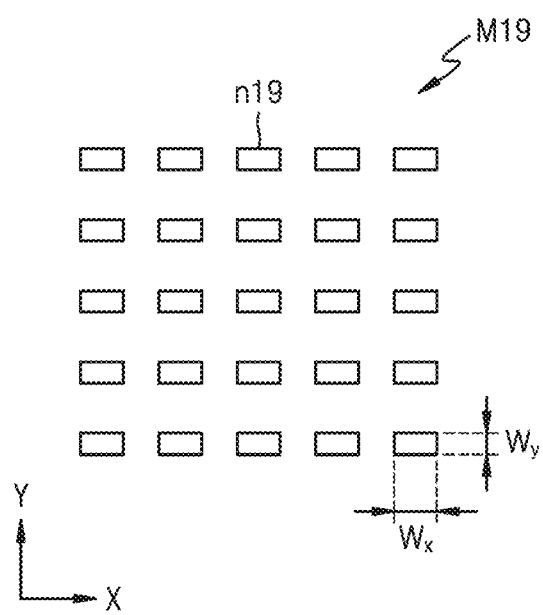
FIG. 15C is a plan view illustrating an array of the plurality of nanostructures included in a metamaterial layer of FIG. 15B.

FIG. 15C is a plan view illustrating an array of the plurality of nanostructures n19 included in the metamaterial layer M19 of FIG. 15B.

Referring to FIG. 15C, the plurality of nanostructures n19 may be arranged in a certain direction. Each of the plurality of nanostructures n19 may have a rectangular shape having a width of $W_x$ in the X axis direction and a width of $W_y$ in the Y axis direction. For example, each of the plurality of nanostructures n19 may have the shape of a column including a-Si. However, the constituent materials and shapes of the plurality of nanostructures n19 may be variously changed. For example, in each of the plurality of nanostructures n19, a planar structure on an XY plane may be formed as a rectangular or elliptical structure or an anisotropic structure similar thereto.

Figure 16:
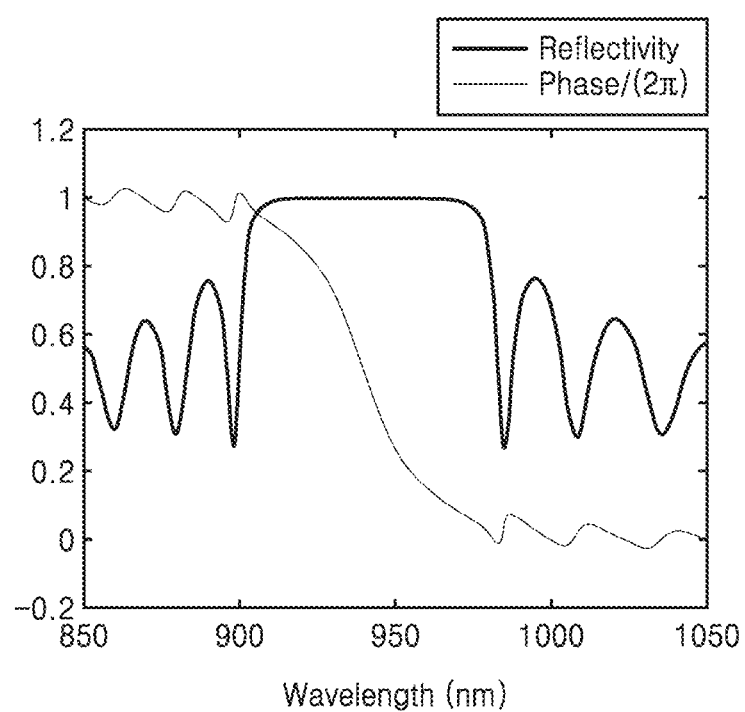
FIG. 16 is a graph showing a reflectivity change and a phase change for a lower substructure of the VCSEL of FIG. 15B.

FIG. 16 is a graph showing a reflectivity change and a phase change for a lower substructure of the VCSEL of FIG. 15B. That is, a reflectivity change and a phase change, which are caused by the DBR 250, are shown. Referring to FIG. 16, the DBR 250 exhibits a high reflectivity in a wavelength range of about 900 nm to about 1000 nm.

Figure 17A:
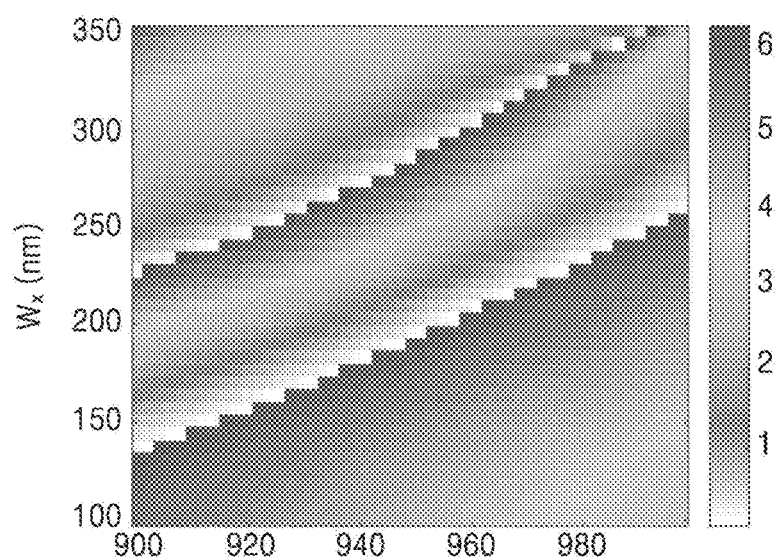
FIGS. 17A and 17B are graphs showing a reflection phase for an upper structure of the VCSEL of FIG. 15B.
Figure 17B:
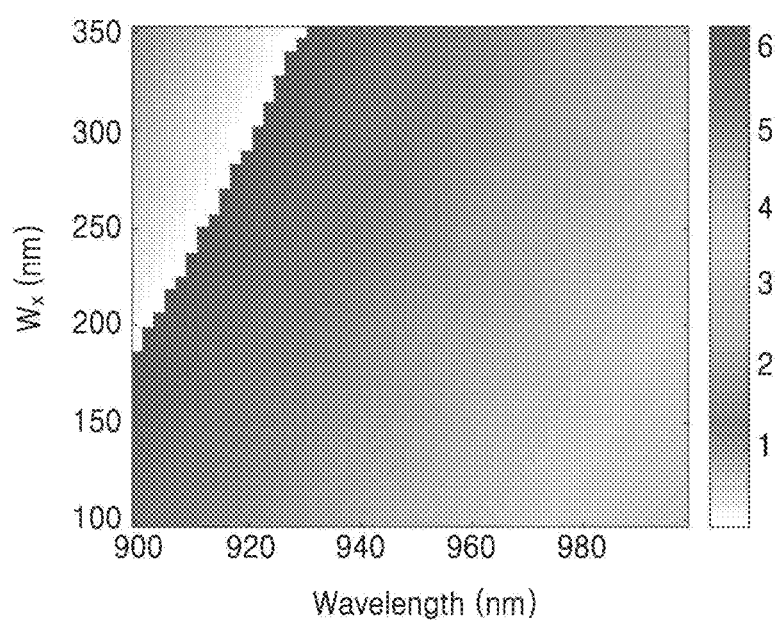

FIGS. 17A and 17B are graphs showing a reflection phase for an upper structure, i.e., the metamaterial-based reflector 190, of the VCSEL of FIG. 15B. The graph of FIG. 17A shows a result for X-polarized light, and the graph of FIG. 17B shows a result for Y-polarized light.

Referring to FIGS. 17A and 17B, the reflection phase for the X-polarized light may be changed by $2\pi$ or more at a wavelength of about 900 nm to about 1000 nm by changing the width $W_x$. Thus, the resonant wavelength of the metamaterial-based reflector 190 for the X-polarized light may be adjusted by changing the width $W_x$. The reflection phase for the Y-polarized light may be changed to less than 2 radians by changing the width $W_x$ as a condition that may remove Y-polarized resonance within a wavelength range of interest. In this example, the nanostructures n19 are a-Si nano-posts and have heights of about 420 nm, the widths Wy of the nanostructures n19 are about 100 nm, and the lattice constants of the nanostructures n19 are 400 nm. The DBR R19 has 4 pairs of a-Si/SiO$_2$.

Figure 18:
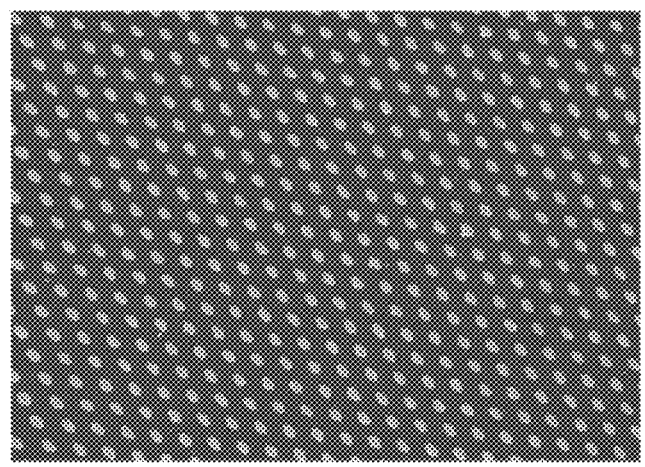
FIGS. 18 and 19 are images showing an array of nanostructures of a metamaterial layer that may be applied to a metamaterial-based reflector according to an example embodiment.
Figure 19:
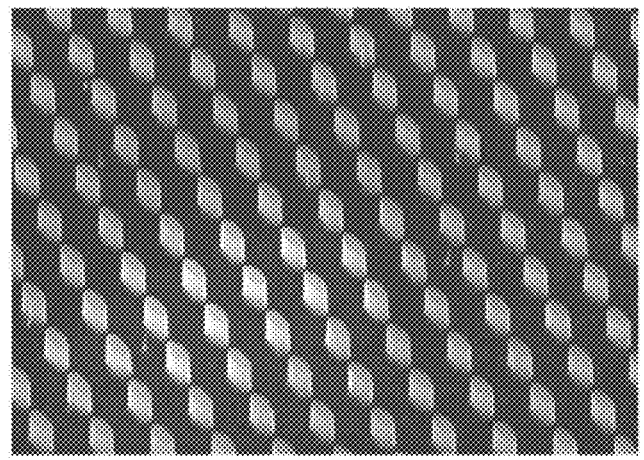

FIGS. 18 and 19 are images showing an array of nanostructures of a metamaterial layer that may be applied to a metamaterial-based reflector according to an example embodiment.

Referring to FIGS. 18 and 19, the metamaterial layer may include cylinder-shaped nanostructures such as meta-atoms having high refractive indexes. In this Example, the nanostructures such as meta-atoms may have rectangular or elliptical cross-sections. The metamaterial layer of FIGS. 18 and 19 may be a transmissive birefringent meta-surface layer.

It should be understood that the example embodiments described herein should be considered in a descriptive sense only and not for purposes of limitation. Those skilled in the art will appreciate that the metamaterial-based reflectors, optical cavity structures, VCSELs, and optical devices described with reference to FIGS. 1A to 15C may be variously modified. For example, the arrays of the first and second metamaterial layers may be variously modified, three or more metamaterial layers may be combined, and the VCSELs may be variously modified.

While example embodiments have been described with reference to the figures, it will be understood by those of ordinary skill in the art that various changes in form and details may be made therein without departing from the spirit and scope as defined by the following claims.

What is claimed is:

1. A metamaterial-based reflector comprises:
a first metamaterial layer comprising an array of first nanostructures; and
a second metamaterial layer provided on the first metamaterial layer, the second metamaterial layer comprising an array of second nanostructures,
wherein the second nanostructures are arranged differently from the first nanostructures.

2. The metamaterial-based reflector of claim 1, wherein the first nanostructures are arranged in a first direction and in a first pattern, and the second nanostructures are arranged in a second direction that is different from the first direction and in a second pattern that is different from the first pattern.

3. The metamaterial-based reflector of claim 1, wherein the first nanostructures are arranged in parallel with each other in a first direction, and
wherein the second nanostructures are arranged in a second direction that is different from the first direction or in a plurality of directions that are different from the first direction based on regions of the second metamaterial layer.

4. The metamaterial-based reflector of claim 1, wherein the first metamaterial layer comprises a transmissive wave plate, and
the second metamaterial layer comprises a reflective wave plate.

5. The metamaterial-based reflector of claim 4, wherein the first nanostructures are arranged in parallel with each other in a first direction, and
wherein the second nanostructures are arranged in parallel with each other in a second direction that is rotated by $\theta$ with respect to the first direction, $\theta$ being less than 90 degrees.

6. The metamaterial-based reflector of claim 4, wherein the first nanostructures are arranged in parallel with each other in a first direction, and
wherein the second nanostructures are arranged in a plurality of directions that are rotated with respect to the first direction, and angles of rotation of the second nanostructures are different based on regions of the second metamaterial layer.

7. The metamaterial-based reflector of claim 4, wherein the metamaterial-based reflector is configured to circularly polarize light that is transmitted through the metamaterial-based reflector.

8. The metamaterial-based reflector of claim 4, wherein the second nanostructures are arranged such that the metamaterial-based reflector operates as a converging mirror or a diverging mirror.

9. The metamaterial-based reflector of claim 1, wherein the first metamaterial layer comprises a first transmissive wave plate and the second metamaterial layer comprises a second transmissive wave plate, and
wherein the metamaterial-based reflector further comprises a distributed Bragg reflector provided on the second metamaterial layer opposite to the first metamaterial layer.

10. The metamaterial-based reflector of claim 9, wherein the first nanostructures are arranged in parallel with each other in a first direction, and
wherein the second nanostructures are arranged in parallel with each other in a second direction that is rotated by $\theta$ with respect to the first direction, and $\theta$ is less than 90 degrees.

11. The metamaterial-based reflector of claim 9, wherein the first nanostructures are arranged in parallel with each other in a first direction, and
wherein the second nanostructures are arranged in a plurality of directions that are rotated with respect to the first direction, and angles of rotation of the second nanostructures are different based on regions of the second metamaterial layer.

12. The metamaterial-based reflector of claim 9, wherein the metamaterial-based reflector is configured to linearly polarize light that is transmitted through the metamaterial-based reflector.

13. The metamaterial-based reflector of claim 9, wherein the second nanostructures are arranged so that the metamaterial-based reflector is configured to operate as a converging mirror or a diverging mirror.

14. An optical device comprising at least one metamaterial-based reflector, the at least one metamaterial-based reflector comprising:
a first metamaterial layer comprising an array of first nanostructures; and
a second metamaterial layer provided on the first metamaterial layer, the second metamaterial layer comprising an array of second nanostructures, wherein second nanostructures are arranged differently from first nanostructures.

15. An optical cavity structure comprising:
a gain layer configured to generate light;
a first distributed Bragg reflector provided on a first surface of the gain layer; and
a metamaterial-based reflector provided on a second surface of the gain layer opposite to the first distributed Bragg reflector,
wherein the metamaterial-based reflector comprises:
a first metamaterial layer comprising an array of first nanostructures; and
a second metamaterial layer provided on the first metamaterial layer, the second metamaterial layer comprising an array of second nanostructures,
wherein the second nanostructures are arranged differently from the first nanostructures.

16. The optical cavity structure of claim 15, wherein the first nanostructures are arranged in parallel with each other in a first direction, and
wherein the second nanostructures are arranged in parallel with each other in a second direction that is different from the first direction or arranged in a plurality of directions that are rotated from the first direction based on regions of the second metamaterial layer.

17. The optical cavity structure of claim 15, wherein the first nanostructures are arranged in parallel with each other in a first direction, and
wherein the second nanostructures are arranged in parallel with each other in a second direction that is rotated by θ with respect to the first direction, and θ is less than 90 degrees.

18. The optical cavity structure of claim 15, wherein the first nanostructures are arranged in parallel with each other in a first direction,
wherein the second nanostructures are arranged in a plurality of directions that are rotated with respect to the first direction, and angles of rotation of the second nanostructures are different based on regions of the second metamaterial layer.

19. The optical cavity structure of claim 15, wherein the first metamaterial layer comprises a transmissive wave plate, and
the second metamaterial layer comprises a reflective wave plate.

20. The optical cavity structure of claim 15, wherein the first metamaterial layer comprises a first transmissive wave plate and the second metamaterial layer comprises a second transmissive wave plate, and wherein the metamaterial-based reflector further comprises a second distributed Bragg reflector provided on the second metamaterial layer opposite to the first metamaterial layer.

21. The optical cavity structure of claim 15, wherein the metamaterial-based reflector is configured to circularly polarize the light that is transmitted through the metamaterial-based reflector.

22. The optical cavity structure of claim 15, wherein the metamaterial-based reflector is configured to linearly polarize the light that is transmitted through the metamaterial-based reflector.

23. The optical cavity structure of claim 15, wherein the second nanostructures are arranged so that the metamaterial-based reflector is configured to operate as a converging mirror or a diverging mirror.

24. A vertical cavity surface emitting laser comprising an optical cavity structure, the optical cavity structure comprising:
a gain layer configured to generate light;
a distributed Bragg reflector provided on a first surface of the gain layer; and
a metamaterial-based reflector provided on a second surface of the gain layer opposite to the distributed Bragg reflector,
wherein the metamaterial-based reflector comprises:
a first metamaterial layer comprising an array of first nanostructures; and
a second metamaterial layer provided on the first metamaterial layer, the second metamaterial layer comprising an array of second nanostructures,
wherein the second nanostructures are arranged differently from the first nanostructures.

25. The optical cavity structure of claim 15 further comprising:
a contact layer provided between the gain layer and the metamaterial-based reflector.

26. The optical cavity structure of claim 25 further comprising an aperture layer provided on the gain layer, the aperture layer being configured to adjust at least one of a size of light and an oscillation of light.

27. The optical cavity structure of claim 15 further comprising a first electrode that is provided on the first surface of the gain layer and a second electrode that is provided on the second surface of the gain layer.

* * * * *